(12) United States Patent
Miura et al.

(10) Patent No.: US 7,491,967 B2
(45) Date of Patent: Feb. 17, 2009

(54) FIELD EFFECT TRANSISTOR, METHOD OF PRODUCING THE SAME, AND METHOD OF PRODUCING LAMINATED MEMBER

(75) Inventors: Daisuke Miura, Numazu (JP); Tomonari Nakayama, Yokohama (JP); Toshinobu Ohnishi, Yokohama (JP); Makoto Kubota, Kawasaki (JP); Akane Masumoto, Yokohama (JP); Hidetoshi Tsuzuki, Kawasaki (JP); Makiko Miyachi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 325 days.

(21) Appl. No.: 10/555,614

(22) PCT Filed: Mar. 9, 2005

(86) PCT No.: PCT/JP2005/004586

§ 371 (c)(1), (2), (4) Date: Nov. 4, 2005

(87) PCT Pub. No.: WO2005/086254

PCT Pub. Date: Sep. 15, 2005

(65) Prior Publication Data
US 2007/0012914 A1    Jan. 18, 2007

(30) Foreign Application Priority Data
Mar. 10, 2004    (JP)    .............. 2004-067671

(51) Int. Cl.
*H01L 51/00*    (2006.01)
*H01L 51/05*    (2006.01)

(52) U.S. Cl. ............. 257/40; 257/642; 257/E51.007; 257/E51.005; 438/99

(58) Field of Classification Search .......... 257/40, 257/E51.007, 642, E51.005, E51.01, E27.117, 257/E25, E21.007; 438/99, FOR. 135
See application file for complete search history.

(56) References Cited

U.S. PATENT DOCUMENTS 6,617,609 B2 *    9/2003    Kelley et al. ............. 257/40

(Continued)

FOREIGN PATENT DOCUMENTS

JP    5-55568    3/1993

(Continued)

OTHER PUBLICATIONS

T. Akiyama, et al., "Synthesis of .pai.-system-expanded compounds using Diels-Alder reactions", Proceedings of the 81st Annual Spring Meeting of the Chemical Society of Japan, 2002, II, p. 990, 2F9-14. (with translation).

(Continued)

*Primary Examiner*—Matthew Smith
*Assistant Examiner*—Julio J. Maldonado
(74) *Attorney, Agent, or Firm*—Fitzpatrick, Cella, Harper & Scinto

(57) ABSTRACT

There is provided a field effect transistor having an organic semiconductor layer, including: an organic semiconductor layer containing at least porphyrin; and a layer composed of at least a polysiloxane compound, the layer being laminated on the organic semiconductor layer so as to be in intimate contact with the organic semiconductor layer. As a result, there can be provided a field effect transistor which enables an organic semiconductor layer having high crystallinity and high orientation to be formed and which exhibits a high mobility.

4 Claims, 5 Drawing Sheets

U.S. PATENT DOCUMENTS

| | | | |
|---|---|---|---|
| 6,891,237 B1 * | 5/2005 | Bao et al. | 257/410 |
| 7,094,625 B2 | 8/2006 | Miura et al. | 438/99 |
| 7,193,237 B2 * | 3/2007 | Aramaki et al. | 257/40 |
| 2003/0226996 A1 | 12/2003 | Aramaki et al. | 252/62.3 |
| 2005/0202348 A1 | 9/2005 | Nakayama et al. | 430/311 |
| 2006/0081880 A1 | 4/2006 | Miyazaki et al. | 257/200 |
| 2006/0145141 A1 | 7/2006 | Miura et al. | 257/40 |
| 2006/0214159 A1 | 9/2006 | Nakayama et al. | 257/40 |

FOREIGN PATENT DOCUMENTS

| | | |
|---|---|---|
| JP | 5-190877 | 7/1993 |
| JP | 2003-304014 | 10/2003 |
| JP | 2004-6750 | 1/2004 |
| WO | 03/041186 | 5/2003 |
| WO | 2004/012271 | 2/2004 |

OTHER PUBLICATIONS

A. R. Brown, et al., "Precursor route pentacene metal-insulator-semiconductor field-effect transistors", Journal of Applied Physics, vol. 79, No. 4, Feb. 15, 1996, pp. 2136-2138.

Christos D. Dimitrakopoulos, et al., "Organic Thin Film Transistors for Large Area Electronics", Advanced Materials, vol. 14, No. 2, Jan. 16, 2002, pp. 99-117.

W. Nakwaski, et al., "Temperature Profiles in Etched-Well Surface-Emitting Semiconductor Lasers", Japanese Journal of Applied Physics, vol. 30, No. 4A, Apr. 1991, pp. L596-L598.

H. Sirringhaus, et al., "Two-dimensional charge transport in self-organized, high-mobility conjugated polymers", Nature, vol. 401, Oct. 14, 1999, pp. 685-688.

* cited by examiner

FIELD EFFECT TRANSISTOR, METHOD OF PRODUCING THE SAME, AND METHOD OF PRODUCING LAMINATED MEMBER

TECHNICAL FIELD

The present invention relates to a field effect transistor, a method of producing the field effect transistor, and a method of producing a laminated member.

BACKGROUND ART

Development of a thin film transistor using an organic semiconductor has gradually become active since the latter half of 1980s. In recent years, the basic performance of the thin film transistor using the organic semiconductor has exceeded the properties of a thin film transistor of amorphous silicon. The use of an organic material as a semiconductor layer in a thin film device is attractive because the organic material can be easily processed and often has a high affinity for a plastic substrate on which a thin film field effect transistor (FET) is formed. Examples of the researches on organic semiconductors reported heretofore include: acenes such as pentacene and tetracene disclosed in Japanese Patent Application Laid-Open No. H05-55568; phthalocyanines including lead phthalocyanine, low-molecular weight compounds such as perylene and tetracarboxylic acid derivatives thereof disclosed in Japanese Patent Application Laid-Open No. H05-190877; aromatic oligomers typified by thiophene hexamers called α-thienyl or sexthiophene and high molecular compounds such as polythiophene, polythienylenevinylene, and poly-p-phenylene vinylene disclosed in Japanese Patent Application Laid-Open No. H05-190877. Most of those compounds are described in Advanced Material, 2002, vol. 14, no. 2, p. 99-117.

The properties such as nonlinear optical properties, conductivity, and semiconductivity necessary for using those compounds as semiconductor layers to obtain devices greatly depend on not only the purity of the material but also the crystallinity and orientation of the material. A compound with an extended π conjugated system is typically insoluble or hardly soluble in a solvent. For example, a pentacene thin film is produced by means of vacuum vapor deposition because pentacene has high crystallinity and is insoluble in a solvent. The pentacene thin film produced by means of vacuum vapor deposition is known to exhibit a high field effect mobility, but involves a problem in that the pentacene thin film is unstable in the air, is susceptible to oxidation, and is thus apt to deteriorate.

On the other hand, an organic semiconductor using as an organic semiconductor film a π conjugated system polymer is excellent in processability. For example, the organic semiconductor can easily be formed into a thin film by means of solution coating or the like. Therefore, the applied development of the organic semiconductor has been pursued ("Japanese Journal of Applied Physics", The Japan Society of Applied Physics, 1991, vol. 30, p. 596-598). The arrangement state of molecular chains is known to largely affect the electrical conductivity of the π conjugated system polymer. Similarly, it has been reported that the field effect mobility of a π conjugated system polymer field effect transistor greatly depends on the arrangement state of molecular chains in a semiconductor layer ("Nature", Nature Publishing Group, 1999, vol. 401, p. 685-687). However, the arrangement of molecular chains in the π conjugated system polymer is performed during the period from the application of a solution to the drying of the solution, so the arrangement state of the molecular chains may vary to a large extent owing to a change in environment and a difference in application method.

In addition, an FET has been reported, which uses a film obtained by: forming a thin film of a soluble precursor of pentacene by application; and transforming the precursor into pentacene through heat treatment (J. Appl. Phys., vol. 79, 1996, p. 2136). In this case, the transformation of the precursor into pentacene involves the necessity for high temperature treatment or for removal of an eliminated component having a large mass under reduced pressure.

Furthermore, it has been reported that tetrabenzoporphyrin obtained by heating, at 210° C. or higher, porphyrin in which a bulky bicyclo[2.2.2]octadiene skeleton is condensed can be used as an organic semiconductor (The Chemical Society of Japan 81st spring annual meeting, 2002 conference proceedings II, p. 990 (2F9-14), Japanese Patent Application Laid-Open No. 2003-304014, and Japanese Patent Application Laid-Open No. 2004-6750). However, it can never be said that the carrier mobilities described in those publications are excellent. That is, in order to provide sufficient properties for an organic semiconductor, further investigation into the attainment of an optimum crystalline orientation is considered to be necessary for the purpose of increasing a carrier mobility.

As described above, for a field effect transistor using an organic semiconductor compound, a semiconductor layer having crystallinity and orientation has been formed by undergoing a process such as vacuum film formation. For example, an acene is a representative example of the organic semiconductor compound. However, there has involved a problem in that the acene is susceptible to oxidation, and is thus apt to deteriorate. In addition, a film obtained by a simple method using application method faces the task of establishing an approach to forming a film excellent in both of orientation and crystallinity.

DISCLOSURE OF THE INVENTION

The present invention has been made in order to solve the above problems, and an object of the present invention is to provide a field effect transistor which enables an organic semiconductor layer having high crystallinity and high orientation to be formed and which exhibits a high field effect mobility.

Another object of the present invention is to provide a method of producing a field effect transistor which enables the above field effect transistor to be easily obtained.

According to one aspect of the present invention, there is provided a field effect transistor having an organic semiconductor layer, including: an organic semiconductor layer containing at least porphyrin; and a layer composed of at least a polysiloxane compound, the layer being laminated on the organic semiconductor layer so as to be in intimate contact with the organic semiconductor layer. Unless otherwise stated, the term "porphyrin" in the description including the claims in the specification is a concept comprehending a wide variety of porphyrins, and means a compound having a porphyrin skeleton. In the specification, the term "porphyrin" is a concept also comprehending metal porphyrin derivatives such as a tetrabenzoporphyrin copper complex. In addition, the term "polysiloxane compound" means a compound having multiple siloxane bonds, and is a concept comprehending an organopolysiloxane, a polysilsexyoxane, and the like. In addition, those layers may contain other compounds as long as the functions of the compounds of the layers are not impaired.

In further aspect of the field effect transistor, the polysiloxane compound is represented by the following general formula (1):

General Formula (1)

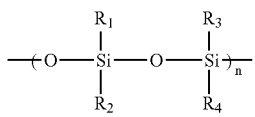

(In the formula, $R_1$ to $R_4$ each represent a substituted or unsubstituted alkyl or alkenyl group having 1 to 5 carbon atoms, a substituted or unsubstituted phenyl group, or a siloxane unit. $R_1$ to $R_4$ may be identical to or different from one another. n represents an integer of 1 or more.) In further aspect of the field effect transistor, the polysiloxane compound is a polysilsesquioxane compound represented by the following general formula (2) and/or the following general formula (6):

General Formula (2)

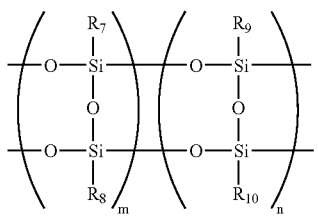

(In the formula, $R_7$ to $R_{10}$ each represent a substituted or unsubstituted alkyl or alkenyl group having 1 to 5 carbon atoms, or a substituted or unsubstituted phenyl group. $R_7$ to $R_{10}$ may be identical to or different from one another m and n each represent an integer of 0 or more, and the sum of m and n is an integer of 1 or more. A copolymerization form may be random copolymerization or block copolymerization.)

General Formula (6):

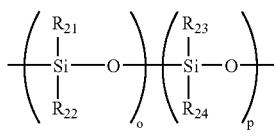

(In the formula, $R_{21}$ to $R_{24}$ each represent a substituted or unsubstituted alkyl or alkenyl group having 1 to 5 carbon atoms, or a substituted or unsubstituted phenyl group. $R_{21}$ to $R_{24}$ may be identical to or different from one another. o and p each represent an integer of 0 or more, and the sum of o and p is an integer of 1 or more. A copolymerization form may be random copolymerization or block copolymerization.).

In further aspect of the field effect transistor, the porphyrin is represented by the following general formula (3):

General Formula (3)

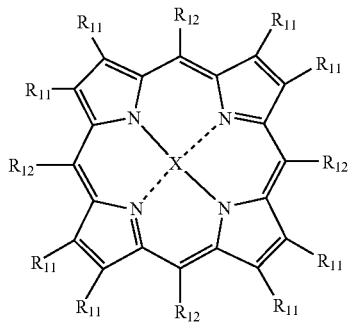

(In the formula, $R_{11}$'s represent at least one kind selected from the group consisting of a hydrogen atom, a halogen atom, a hydroxyl group, or an alkyl, oxyalkyl, thioalkyl, or alkylester group having 1 to 12 carbon atoms, and $R_{11}$'s may be identical to or different from one another. In addition, adjacent $R_{11}$'s may form an aromatic ring which may have a substituent. In addition, the adjacent $R_{11}$'s may be connected to a porphyrin ring which may have a substituent through the formed aromatic ring. $R_{12}$'s represent at least one kind selected from the group consisting of a hydrogen atom and an aryl group which may have a substituent. $R_{12}$'s may be identical to or different from one another. X represents a hydrogen atom or a metal atom.)

In further aspect of the field effect transistor, at least one pair of the adjacent $R_{11}$'s in the general formula (3) forms an aromatic ring.

In further aspect of the field effect transistor, the aromatic ring formed by the at least one pair of the adjacent $R_{11}$'s in the general formula (3) is obtained by heating a precursor having a bicyclo[2.2.2]octadiene skeleton structure which may have a substituent.

In further aspect of the field effect transistor, Bragg angles (2θ) of CuKα X-ray diffraction in the organic semiconductor layer have peaks at 8.3°±0.2°, 10.1°±0.2°, 11.8°±0.2°, and 14.4°±0.2°.

In further aspect of the field effect transistor, Bragg angles (2θ) of CuKα X-ray diffraction in the organic semiconductor layer have peaks at 8.4°±0.2°, 11.9°±0.2°, and 16.9°±0.2°.

In further aspect of the field effect transistor, Bragg angles (2θ) of CuKα X-ray diffraction in the organic semiconductor layer have peaks at 7.2°±0.2°, 7.8°±0.2°, 11.7°±0.2°, and 23.5°±0.2°.

In further aspect of the field effect transistor, Bragg angles (2θ) of CuKα X-ray diffraction in the organic semiconductor layer have peaks at 7.3°±0.2°, 7.8°±0.2°, 11.7°±0.2°, and 19.6°±0.2°.

According to another aspect of the present invention, there is provided a method of producing a field effect transistor having an organic semiconductor layer, including the step of laminating an organic semiconductor layer containing at least porphyrin and a layer composed of at least a polysiloxane compound in such a manner that the layers are in intimate contact with each other.

In further aspect of the method of producing a field effect transistor having an organic semiconductor layer, the polysiloxane compound is represented by the general formula (1).

In further aspect of the method of producing a field effect transistor having an organic semiconductor layer, the polysiloxane compound is a polysiloxane compound represented by the general formula (2) and/or the general formula (6).

In further aspect of the method of producing a field effect transistor having an organic semiconductor layer, the porphyrin is represented by the general formula (3).

In further aspect of the method of producing a field effect transistor having an organic semi conductor layer, at least one pair of the adjacent $R_{11}$'s, in the general formula (3) forms an aromatic ring.

In further aspect of the method of producing a field effect transistor having an organic semiconductor layer, the aromatic ring formed by the at least one pair of the adjacent $R_{11}$'s in the general formula (3) is obtained by heating a precursor having a bicyclo[2.2.2]octadiene skeleton structure which may have a substituent.

In further aspect of the method of producing a field effect transistor having an organic semiconductor layer, Bragg angles (2θ) of CuKα X-ray diffraction in the organic semiconductor layer form peaks at 8.3°±0.2°, 10.1°±0.2°, 11.8°±0.2°, and 14.4°±0.2°.

In further aspect of the method of producing a field effect transistor having an organic semiconductor layer, Bragg angles (2θ) of CuKα X-ray diffraction in the organic semiconductor layer form peaks at 8.4°±0.2°, 11.9°±0.2°, and 16.9°±0.2°.

In further aspect of the method of producing a field effect transistor having an organic semiconductor layer, Bragg angles (2θ) of CuKα X-ray diffraction in the organic semiconductor layer form peaks at 7.2°±0.2°, 7.8°±0.2°, 11.7°±0.2°, and 23.5°±0.2°.

In further aspect of the method of producing a field effect transistor having an organic semiconductor layer, Bragg angles (2θ) of CuKα X-ray diffraction in the organic semiconductor layer form peaks at 7.3°±0.2°, 7.8°±0.2°, 11.7°±0.2°, and 19.6°±0.2°.

According to another aspect of the present invention, there is provided a method of producing a laminated member having an organic semiconductor layer, including at least the steps of: providing a crystallization promoting layer on a substrate; providing an organic semiconductor precursor on the crystallization promoting layer; and applying energy to the organic semiconductor precursor to form a layer composed of an organic semiconductor.

In further aspect of the method of producing a laminated member, the crystallization promoting layer has a function of promoting bonding between crystal grains.

In further aspect of the method of producing a laminated member, the energy is light energy or heat energy.

In further aspect of the method of producing a laminated member, the step of applying energy to the organic semiconductor precursor to form a layer composed of an organic semiconductor includes a step of allowing the organic semiconductor precursor to cause an elimination reaction.

In further aspect of the method of producing a laminated member, the elimination reaction is a retro Diels-Alder reaction.

In further aspect of the method of producing a laminated member, the energy is continuously applied even after completion of the elimination reaction.

In further aspect of the method of producing a laminated member, the step of providing the organic semiconductor precursor is a step of applying or printing a solution containing the organic semiconductor precursor.

In further aspect of the method of producing a laminated member, the crystallization promoting layer contains a polysiloxane compound.

Furthermore, in the present invention, those methods of producing a laminated member are applied to the methods of producing a field effect transistor.

According to another aspect of the present invention, there is provided a field effect transistor having an organic semiconductor layer, including at least: a substrate; a crystallization promoting layer on the substrate; and the organic semiconductor layer in contact with the crystallization promoting layer.

BEST MODE FOR CARRYING OUT THE INVENTION

Hereinafter, the present invention will be described in detail.

A field effect transistor according to this embodiment is a device having at least an organic semiconductor, an insulator, and a conductor. The insulator is an insulating film (layer) for covering the conductor serving as an electrode. The organic semiconductor is an organic semiconductor layer that responds to a stimulus (electric field) generated by such a conductor (electrode). Specifically, the organic semiconductor layer is a layer the electrical characteristics of which change with an electric field. More specifically, the organic semiconductor layer is a layer the conductivity of which, that is, the amount of a current passing through the organic semiconductor layer, changes with a change in electric field.

Figure 1A:
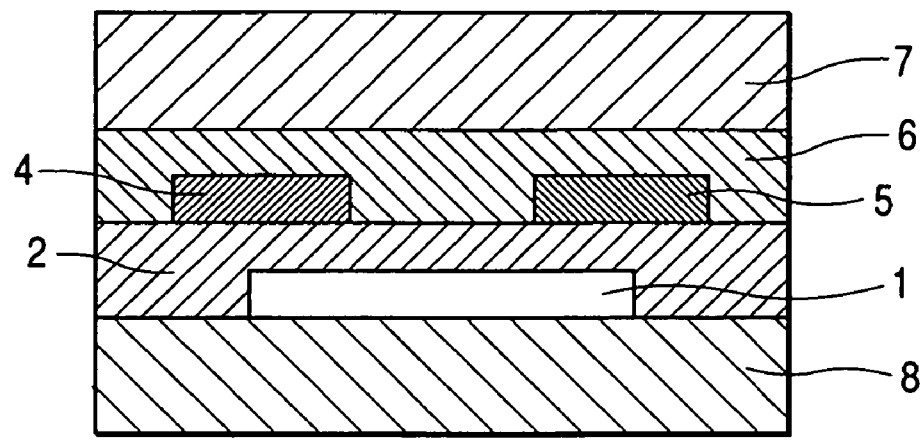
FIGS. 1A and 1B are schematic sectional drawings each showing part of an embodiment of a field effect transistor of the present invention.

FIG. 1A is a schematic sectional drawing showing the field effect transistor according to this embodiment. Reference numeral 8 denotes a substrate; 1, a gate electrode; 2, a gate insulating layer; 4, a source electrode; 5, a drain electrode; 6, an organic semiconductor layer; and 7, a sealing layer. In the device, the gate electrode 1 is placed on the surface of the substrate 8, the gate insulating layer 2 is placed on the gate electrode 1, and the source electrode 4 and the drain electrode 5 are placed on the surface of the insulating layer 3 so as to be separated from each other. In addition, the organic semiconductor layer 6 is placed on the source electrode 4, the drain electrode 5, and the insulating layer 2 serving as a separation region between the electrodes, so as to be in contact with both the electrodes 4 and 5. The insulating layer 2 is placed to cover the gate electrode 1. Furthermore, the organic semiconductor layer 6 is covered with the sealing layer 7. The substrate 8 and the sealing layer 7 may be interchanged with each other.

In the field effect transistor according to this embodiment, when a voltage is applied to the gate electrode 1, a positive or negative charge is induced at an interface between the gate insulating layer 2 and the organic semiconductor layer 6. Furthermore, when a voltage is applied between the source electrode 4 and the drain electrode 5, a charge moves between both the electrodes, thereby generating a current. Therefore, a charge is uniformly generated at the interface between the gate insulating layer 2 and the organic semiconductor layer 6 when a voltage is applied to the gate electrode 1, and further, a charge moves efficiently with little barrier when a voltage is applied between the source electrode 4 and the drain electrode 5, making the transistor exhibit a high field effect mobility.

The inventors of the present invention have made extensive studies to find a method of forming an organic semiconductor layer interface which allows a charge to be uniformly generated and which allows the generated charge to move efficiently. As a result, the inventors have found that, by laminating a specific organic semiconductor material and a layer promoting crystallization (crystallization promoting. layer) with an interface at which a charge moves (the interface between the gate insulating layer 2 and the organic semiconductor layer 6 in FIG. 1A) interposed between them, a crystal which is uniform with little defects can be continuously formed at the interface, so a high field effect mobility is exhibited.

The field effect transistor of the present invention is a field effect transistor having an organic semiconductor layer, wherein the organic semiconductor layer containing at least porphyrin and a layer composed of at least a polysiloxane compound are preferably laminated so as to be in intimate contact with each other. The term "intimate contact" means the state where the organic semiconductor layer is in contact with the layer composed at least a polysiloxane compound via no other layer.

In the present invention, a field effect transistor having a layer composed of a polysiloxane compound (hereinafter, referred to as an A layer) and an organic semiconductor layer having porphyrin (hereinafter, referred to as a B layer) being laminated so as to be in intimate contact with each other in part of or the entire surface of the device is preferable because the field effect transistor exhibits a high field effect mobility. As described later, when a precursor of porphyrin is made soluble, both of the A layer and the B layer can be produced by using an application step, so the device can be produced according to a simple process. Furthermore, as described later, any other crystallization promoting layers having a function of promoting crystallization can be used instead of the A layer, and an organic semiconductor layer the crystallization of which is promoted by the crystallization promoting layer can be used instead of the B layer. In the specification, a base structure on which the crystallization promoting layer is formed (the structure is generally a structure composed of a substrate, a gate electrode, and a gate insulating layer; but the gate insulating layer can be omitted in some cases, the structure can be composed only of the substrate depending on a lamination order, or other layers may be formed in the structure) may be referred to as a substrate. In addition, in the specification, the term "function of promoting crystallization" refers to a function of promoting stabilization of crystal grains (which may involve the movement and rotation of the crystal grains) and/or bonding between the crystal grains. In addition, the term "crystallization promoting layer" refers to a layer promoting stabilization of crystal grains (which may involve the movement and rotation of the crystal grains) and/or bonding between the crystal grains.

Hereinafter, the B layer is formed on the A layer. However, the present invention is not limited thereto although it is preferable to form the B layer on the A layer from the viewpoint of imparting an influence of the A layer during the formation of the B layer.

A polysiloxane compound of the present invention is a polymer having a siloxane structure (—Si—O—) and an organic silane structure. The compound may be a copolymer with another organic or inorganic high molecular compound. In the case of a polymer with another high molecular compound, each of the siloxane structure and the organic silane structure may be introduced into a main chain or may be grafted to a side chain. Crystallization is promoted because the organic semiconductor layer as the B layer hardly receives a constraint from the A layer during crystallization by virtue of the effect of combination of the siloxane structure (—Si—O—) and the organic silane structure.

The polysiloxane compound of the present invention may be linear or cyclic, but preferably has a high order cross-linked or branched structure. The term "high order cross-linked or branched structure" includes a network structure, a ladder-like structure, a basket-like structure, a star-like structure, and a dendritic structure. The cross-linked or branched structure is not necessarily formed through a siloxane structure. The structure may contain a structure in which organic groups such as a vinyl group, an acryloyl group, an epoxy group, and a cinnamoyl group are cross-linked or a structure branched through an organic group which is trifunctional or more.

A layer of the polysiloxane compound of the present invention has a high order cross-linked or branched structure. As a result, unlike a monomolecular layer obtained by allowing an active group on the substrate surface to react with octyltrichlorosilane, hexamethyldisilazane, or the like, the layer of the polysiloxane compound allows an amorphous layer to be formed on a wide area irrespective of the state and shape of the substrate surface. As a result, in at least a range equal to or wider than a region in which a channel is formed, the interface between the A layer and the B layer is uniform. Together with the effect of combination of the siloxane structure and the organic silane structure described above, a crystal which is uniform and has little defects can be continuously formed.

The polysiloxane compound to be used for the A layer of the present invention has, for example, a structure represented by the following general formula (1), and its main chain is a siloxane unit and any one of its side chains is a substituent having an organic group such as a hydrogen atom or a carbon atom.

General Formula (1)

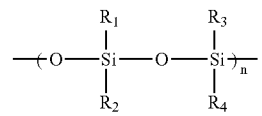

In the formula, $R_1$ to $R_4$ each represent a substituted or unsubstituted alkyl or alkenyl group having 1 to 5 carbon atoms, a substituted or unsubstituted phenyl group, or a siloxane unit. $R_1$ to $R_4$ may be identical to or different from one another. n represents an integer of 1 or more.

The substituents $R_1$ to $R_4$ may be the siloxane units such as those shown below.

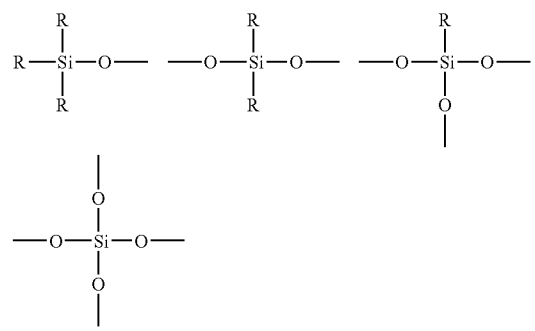

In the formulae, R's each represent a substituted or unsubstituted alkyl or alkenyl group having 1 to 5 carbon atoms, a substituted or unsubstituted phenyl group, or a siloxane unit shown above. R's may be the same functional group or may be different functional groups.)

The shape of the polysiloxane may be of a linear structure, a cyclic structure, a network structure, a ladder-like structure, a basket-like structure, or the like, depending on the kinds of substituents in the formula (1). The polysiloxane to be used in the present invention may be of any of the structures.

Particularly preferable as the polysiloxane compound to be used for the A layer in the present invention is a polysiloxane compound having at least a specific silsesquioxane skeleton represented by the following general formula (2) and/or a specific organosiloxane skeleton represented by the following general formula (6):

General Formula (2)

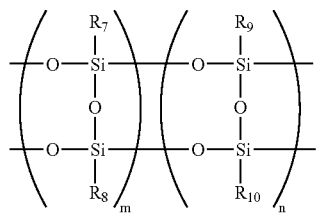

(In the formula, $R_7$ to $R_{10}$ each represent a substituted or unsubstituted alkyl or alkenyl group having 1 to 5 carbon atoms, or a substituted or unsubstituted phenyl group. $R_7$ to $R_{10}$ may be identical to or different from one another. m and n each represent an integer of 0 or more, and the sum of m and n is an integer of 1 or more. A copolymerization form may be random copolymerization or block copolymerization.)

General Formula (6)

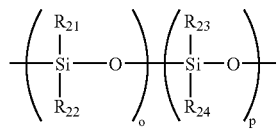

(In the formula, $R_{21}$ to $R_{24}$ each represent a substituted or unsubstituted alkyl or alkenyl group having 1 to 5 carbon atoms, or a substituted or unsubstituted phenyl group. $R_{21}$ to $R_{24}$ may be identical to or different from one another. o and p each represent an integer of 0 or more, and the sum of o and p is an integer of 1 or more. A copolymerization form may be random copolymerization or block copolymerization.)

The polysiloxane compound may contain one or both of the silsesquioxane skeleton represented by the general formula (2) and the organosiloxane skeleton represented by the general formula (6).

In addition, the substituents $R_7$ to $R_{10}$ and $R_{11}$ to $R_{14}$ having carbon atoms corresponding to the side chains of the silsesquioxane skeleton and the organosiloxane skeleton each represent a substituted or unsubstituted alkyl or alkenyl group having 1 to 5 carbon atoms, or a substituted or unsubstituted phenyl group, and they may be the same functional group or may be different functional groups depending on sites. Examples of such a functional group include: an unsubstituted alkyl group such as a methyl group or an ethyl group; an unsubstituted phenyl group; and a substituted phenyl group such as a dimethylphenyl group or a naphthyl group. The substituents $R_7$ to $R_{10}$ may contain various atoms such as an oxygen atom, a nitrogen atom, and a metal atom as well as a carbon atom and a hydrogen atom.

Hereinafter, the silsesquioxane skeleton of the compound used in the present invention will be described. The general formula (2) represents a structural formula having a structure in which m silsesquioxane units (hereinafter, referred to as first units) each having the substituents $R_7$ and $R_8$ are repeated and a structure in which n silsesquioxane units (hereinafter, referred to as second units) each having the substituents $R_9$ and $R_{10}$ are repeated are connected (m and n each represent an integer of 0 or more, and m+n represents an integer of 1 or more). The formula does not mean that the repeated first units and the repeated second units are separated. Both the units may be separately connected or may be connected while being intermingled at random.

The general formula (2) represents a structural formula having a structure in which o diorganosiloxane units (hereinafter, referred to as first units) each having the substituents $R_{11}$ and $R_{12}$ are repeated and a structure in which l diorganosiloxane units (hereinafter, referred to as second units) each having the substituents $R_{13}$ and $R_{14}$ are repeated are connected (o and l each represent an integer of 0 or more, and o+l represents an integer of 1 or more). The formula does not mean that the repeated first units and the repeated second units are separated. Both the units may be separately connected or may be connected while being intermingled at random.

Examples of a method of forming the A layer in the present invention mainly containing a polysiloxane compound having the silsesquioxane skeleton and/or the organosiloxane skeleton represented by the general formulae (2) and (6) include: a method involving applying a solution containing a polyorganosilsesquioxane compound represented by at least one of the following general formulae (4) and (5) and/or a polyorganosiloxane compound represented by at least one of the following general formulae (7) and (8) onto a substrate and drying the applied solution under heating; and a method involving applying a sol obtained by hydrolyzing a silicon monomer onto a substrate and drying the applied sol under heating.

In the method involving drying an applied film of a polyorganosilsesquioxane compound represented by at least one of the following general formulae (4) and (5) and/or a polyorganosiloxane compound represented by at least one of the following general formulae (7) and (8) under heating, the heating causes the terminals of the compound to be condensed through a dehydration or dealcoholization reaction. As a result, the polyorganosilsesquioxane compound is connected in a ladder structure, while the polyorganosiloxane compound is increased in molecular weight and densified. However, at this time, the drying temperature is not high enough for the organic matter to completely disappear. Therefore, the raw material compounds do not have a complete silica structure but have the silsesquioxane skeleton or the organosiloxane skeleton represented by the general formulae (2) and (6) in which most of the substituents remain.

The polyorganosilsesquioxane compounds represented by the general formulae (4) and (5) and the polyorganosiloxane compounds represented by the general formulae (7) and (8), which may be those commercially available, are generally synthesized via reactions represented by the following reaction formulae (11) and (12).

Reaction Formula (11)

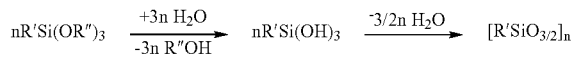

Reaction Formula (12)

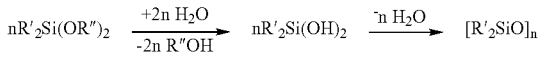

The above reaction formulae (11) and (12) will be described. A trifunctional organic silicon monomer and/or a bifunctional organic silicon monomer each having an organic group R is/are hydrolyzed in a solvent such as alcohol to produce a silanol compound. The silicon monomer shown in the above reaction formulae is an alkoxide from which R"OH is eliminated by hydrolysis. The silicon monomer may also be a chloride, however, in this case, hydrogen chloride is generated as an eliminated component. The silanol compound obtained by hydrolysis is further subjected to dehydration condensation through heating or the like to produce a polyorganosilsesquioxane compound and a polyorganosiloxane compound. Removal of the solvent, a catalyst, and the like leads to the isolation of the polyoroganosilsesquioxane compound and the polyorganosiloxane compound as solids. The structures, molecular weights, kinds of terminal groups, and the like of the resultant compounds can be changed by a catalyst, a solvent, a pH, a concentration, and the like employed at the time of the reactions.

General Formula (4)

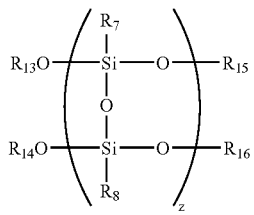

(In the formula, $R_7$ and $R_8$ each represent a substituted or unsubstituted alkyl group having 1 to 5 carbon atoms, or a substituted or unsubstituted phenyl group. $R_7$ and $R_8$ may be the same functional group. $R_{13}$ to $R_{16}$ each represent an alkyl group having 1 to 4 carbon atoms, or a hydrogen atom. z represents an integer of 1 or more.)

General Formula (5)

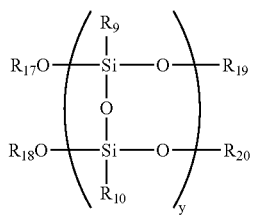

(In the formula, $R_9$ and $R_{10}$ each represent a substituted or unsubstituted alkyl or alkenyl group having 1 to 5 carbon atoms, or a substituted or unsubstituted phenyl group. $R_9$ and $R_{10}$ may be the same functional group. $R_{17}$ to $R_{20}$ each represent an alkyl group having 1 to 4 carbon atoms, or a hydrogen atom. y represents an integer of 1 or more.)

General Formula (7)

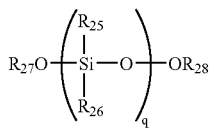

(In the formula, $R_{25}$ and $R_{26}$ each represent a substituted or unsubstituted alkyl or alkenyl group having 1 to 5 carbon atoms, or a substituted or unsubstituted phenyl group. $R_{25}$ and $R_{26}$ may be the same functional group. $R_{27}$ and $R_{28}$ each represent an alkyl group having 1 to 4 carbon atoms, or a hydrogen atom. q represents an integer of 1 or more.)

General Formula (8)

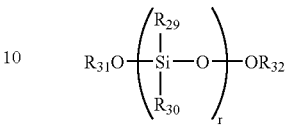

(In the formula, $R_{29}$ and $R_{30}$ each represent a substituted or unsubstituted alkyl or alkenyl group having 1 to 5 carbon atoms, or a substituted or unsubstituted phenyl group. $R_{29}$ and $R_{30}$ may be the same functional group. $R_{31}$ and $R_{32}$ each represent an alkyl group having 1 to 4 carbon atoms, or a hydrogen atom. r represents an integer of 1 or more.).

A small amount of an acid such as formic acid may be added to the application solution for the purpose of aiding a reaction in which silsesquioxane compounds serving as oligomers mutually cross-link during the drying step.

Although the addition amount of an acid is not particularly limited, a cross-linking reaction is promoted when formic acid is added in an amount in the range of 1 wt % to 30 wt % with respect to the solid weight of the polyorganosilsesquioxane compound in the application solution. An addition amount of less 1 wt % provides an insufficient promoting effect on the cross-linking reaction, while an addition amount in excess of 30 wt % may inhibit the film formation after the drying.

The method involving applying a sol obtained by hydrolyzing a silicon monomer onto a substrate and drying the applied sol under heating will be described. The trifunctional silicon monomer and/or the bifunctional silicon monomer shown in the reaction formulae (11) and (12) is/are stirred in a solvent in the coexistence of water and a catalyst at room temperature or under heating, whereby sol is prepared through hydrolysis and dehydration condensation reactions similar to those in the reaction formulae (11) and (12). Heating of the applied film of the resultant sol leads to condensation of silanol and an unreacted alkoxide through a dehydration or dealcoholization reaction. Thus, a dense silsesquioxane or organosiloxane skeleton such as one represented by the general formula (2) or (6) is formed.

Representative examples of a silicon monomer that can be used for preparing sol include: a trifunctional silicon monomer such as methyltrimethoxysilane, methyltriethoxysilane, ethyltrimethoxysilane, ethyltriethoxysilane, butyltrimethoxysilane, vinyltrimethoxysilane, 3-aminopropyltriethoxysilane, or phenyltrimethoxysilane; and a bifunctional silicon monomer such as dimethyldimethoxysilane or diphenyldimethoxysilane.

In preparing a sol, water and a catalyst can be added to promote the hydrolysis of a monomer. The addition amount of water is in the range of 0.1 to 20 equivalents with respect to OR" groups in the monomer in the reaction formula (11) or (12). Meanwhile, an acid catalyst or a basic catalyst can be used for the catalyst. Examples of an available acid catalyst include hydrochloric acid, nitric acid, p-toluenesulfonic acid, trifluoromethanesulfonic acid, acetic acid, formic acid, trifluoroacetic acid and alkylphosphoric acid. Of those, formic acid is more preferable because it is lowly corrosive, and vaporizes during the drying of the applied film under heating so that it does not remain in the film. Examples of an available basic catalyst include sodium hydroxide, potassium hydroxide, and tetramethylammonium hydroxide. Of those, tetramethylammonium hydroxide is preferable because the remaining of an alkali metal such as sodium is responsible for the deterioration of the electrical characteristics of the device. The addition amount of a catalyst is in the range of 1 wt % to 30 wt % with respect to the solid weight of the silicon monomer in the solution. An addition amount of less 1 wt % provides an insufficient promoting effect on the cross-linking reaction, while an addition amount in excess of 30 wt % may deteriorate the film properties after the drying.

In addition, the polyorganosilsesquioxane compounds shown in the general formulae (4) and (5), the polyorganosiloxane compounds shown in the general formulae (7) and (8), and the silicon monomer in the reaction formula (11) or (12) can be mixed for use. In this case, as in the preparation of sol, water and a catalyst can be added. The addition amount of water is in the range of 0.1 to 20 equivalents with respect to OR" groups in the monomer. The addition amount of a catalyst is in the range of 1 wt % to 30 wt % with respect to the solid weight of the mixture of a polyorganosilsesquioxane compound and/or a polyorganosiloxane compound and the silicon monomer.

Furthermore, a tetrafunctional silicon monomer such as tetramethoxysilane or tetraethoxysilane can be used in combination in order to enhance applicability and solvent resistance after the drying.

A heat treatment temperature is preferably 140° C. or higher, more preferably in the range of 150° C. to 230° C. Heating at a temperature lower than 140° C. may result in an insufficient hydrolysis reaction.

A stabilizing agent that does not evaporate, vaporize, or burn out in the above-mentioned temperature range is removed from the solution system as much as possible during the processes of a cross-linking reaction and solvent removal.

An arbitrary solvent such as an alcohol or an ester can be used for the solvent of the application solution. The solvent has only to be selected while wettability with respect to a substrate is taken into consideration.

A method of applying a raw material solution for the A layer is not particularly limited, and the solution is applied by means of any one of the conventional coating methods such as a spin coating method, a cast method, a spray coating method, a doctor blade method, a die coating method, a dipping method, a printing method, an inkjet method, and a dropping method. Of those methods, the spin coating method, the dipping method, the spray coating method, and the inkjet method are preferable because an application amount can be controlled so that a film having a desired thickness is formed. To keep the insulating properties of the resultant film, it is important to minimize the intrusion of dirt or the like in the application solution. Accordingly, it is desirable to filter the raw material solution in advance by means of a membrane filter.

The liquid concentration is preferably adjusted in such a manner that the A layer has a thickness of 10 nm or more, preferably in the range of 15 to 500 nm. This is because a thickness of less than 10 nm makes it difficult to obtain a uniform film.

Prior to the application of the A layer, the substrate may be subjected to surface modification for improving wettability such as ultrasonication in an alkali solution or irradiation with UV.

Next, a preferable aspect of the B layer of the present invention will be described. The B layer preferably contains at least a porphyrin compound represented by the following general formula (3).

General Formula (3)

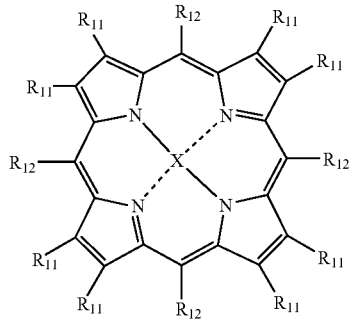

In the formula, $R_{11}$'s represent at least one kind selected from the group consisting of a hydrogen atom, a halogen atom, a hydroxyl group, or an alkyl, oxyalkyl, thioalkyl, or alkylester group having 1 to 12 carbon atoms, and $R_{11}$'s may be identical to or different from one another. In addition, adjacent $R_{11}$'s may form an aromatic ring which may have a substituent. In addition, the adjacent $R_{11}$'s may be connected to a porphyrin ring which may have a substituent through the formed aromatic ring. $R_{12}$'s represent at least one kind selected from the group consisting of a hydrogen atom and an aryl group which may have a substituent. $R_{12}$'s may be identical to or different from one another. X represents a hydrogen atom or a metal atom. Examples of X include: various metals such as H, Cu, Zn, Ni, Co, Mg, and Fe; and atomic groups such as AlCl, TiO, FeCl, and $SiCl_2$. Although X is not particularly limited, X particularly preferably represents a hydrogen atom or a copper atom. Examples of the aromatic ring include a benzene ring, a naphthalene ring, and an anthracene ring.

Such a porphyrin compound can be formed into a film onto the substrate on which the A layer is formed by means of a general approach such as a vacuum vapor deposition method or a dispersion application method.

Hereinafter, examples of a porphyrin compound are shown. Unsubstituted and metal-free structures are mainly shown, but substituents, central metals, and central atomic groups are not limited. Of course, the compound of the present invention is not limited to those examples.

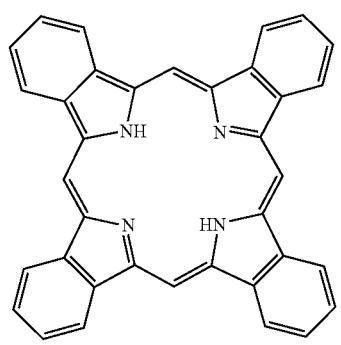

-continued
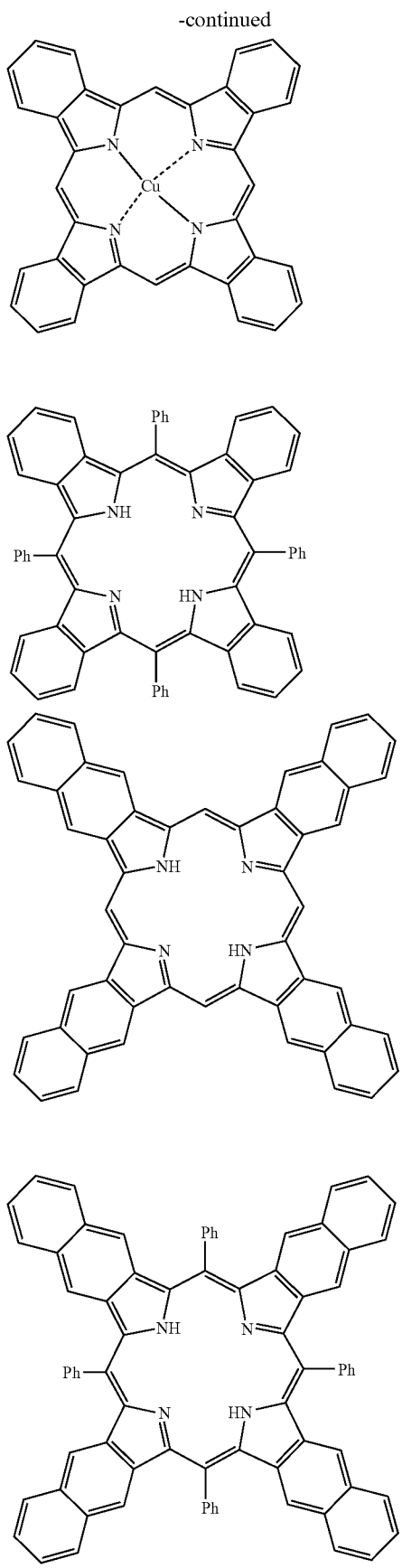
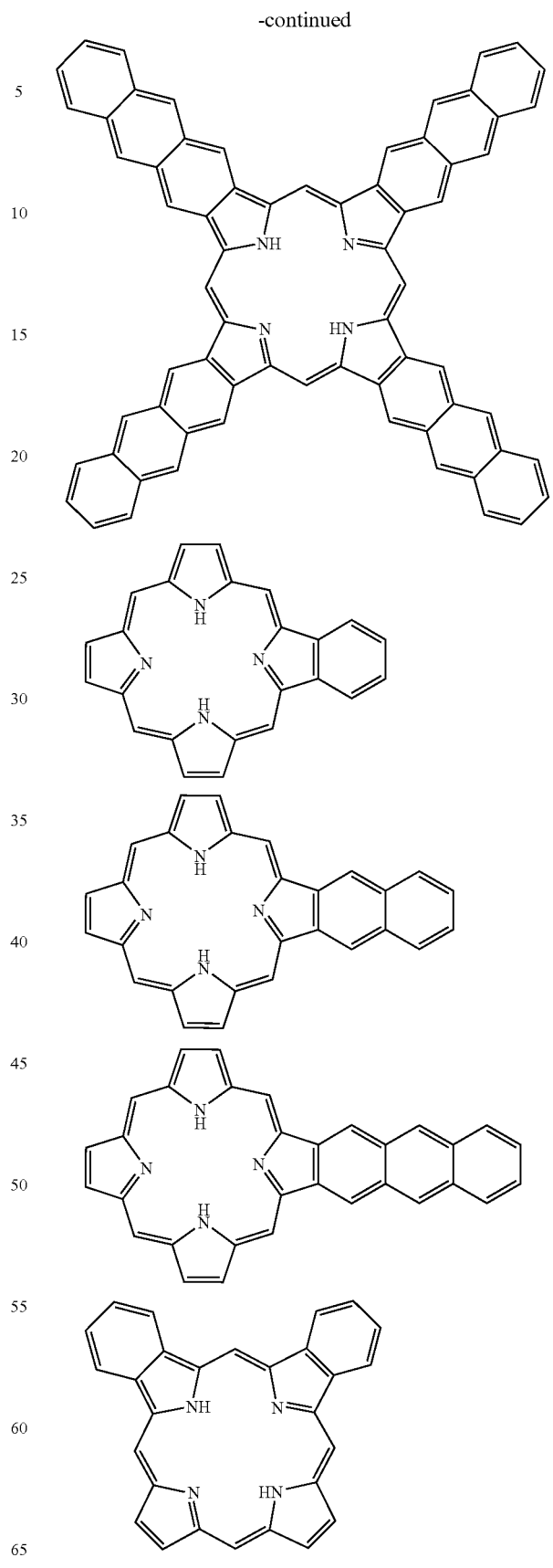

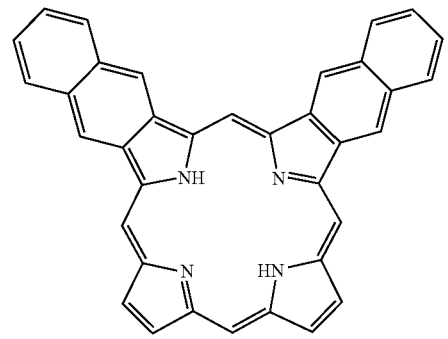
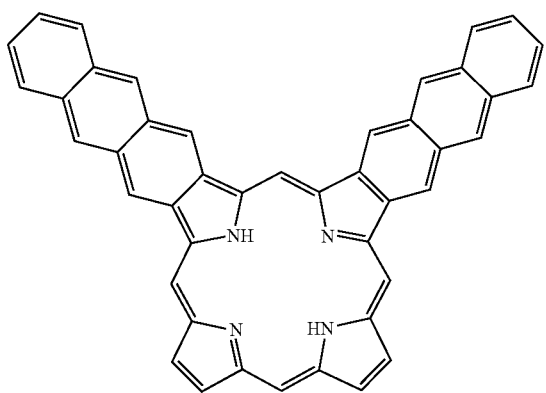
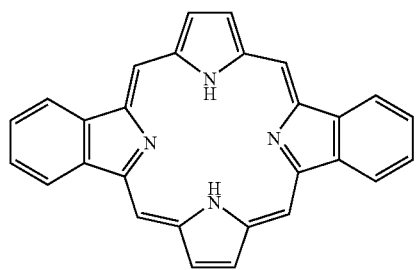
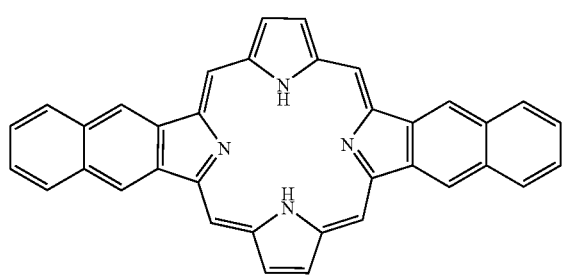
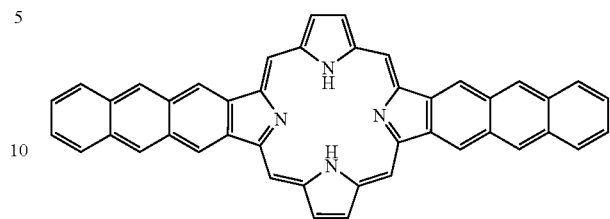
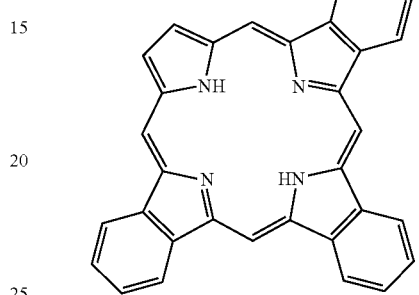
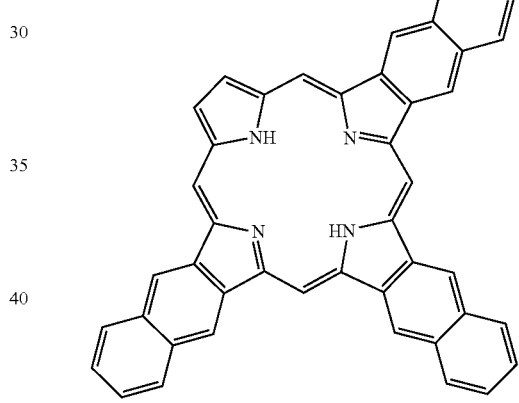
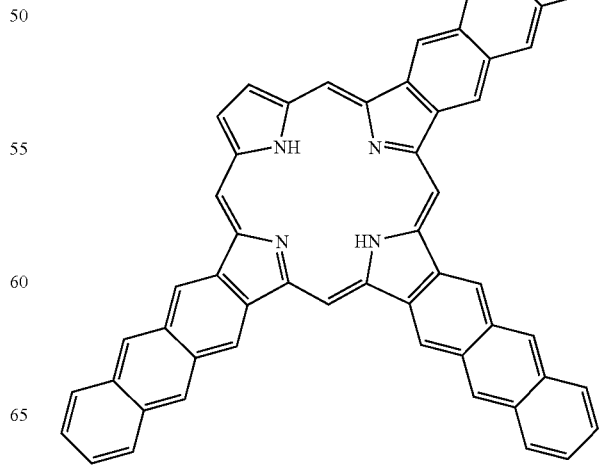

-continued

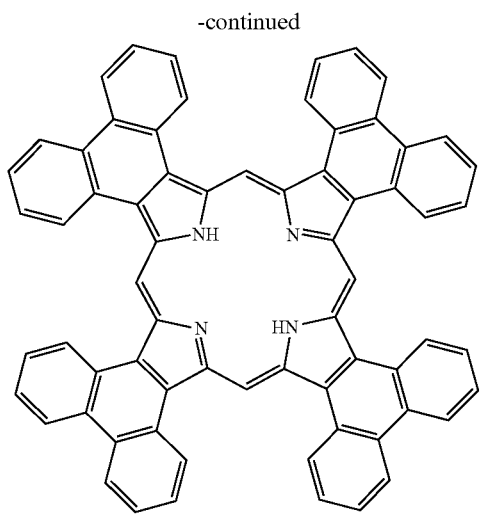

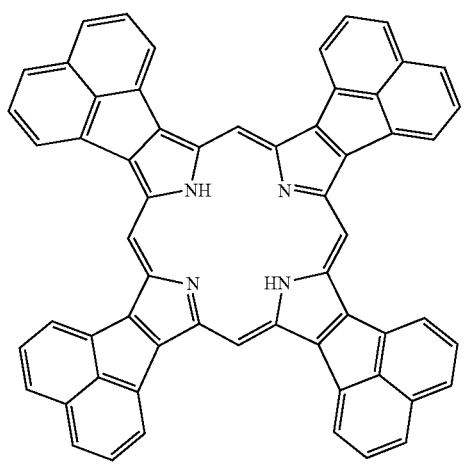

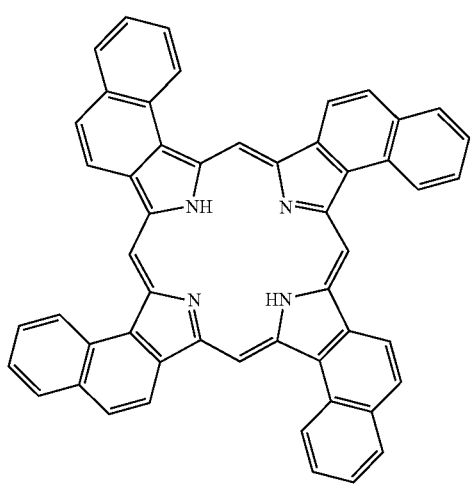

-continued

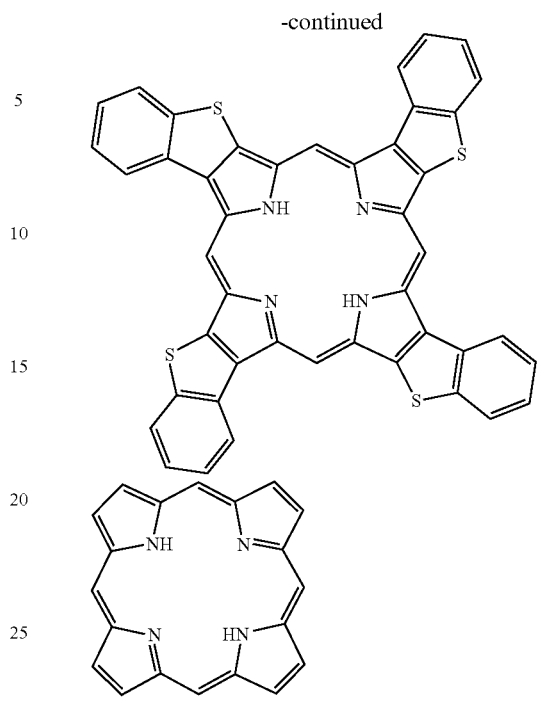

As described above, at least one pair of adjacent $R_{11}$'s in the porphyrin compound represented by the general formula (3) preferably forms an aromatic ring. The aromatic ring is more preferably one that can be obtained by heating an applied film obtained by solvent application of a precursor having a bicyclo[2.2.2]octadiene skeleton structure (hereinafter, referred to as a bicyclo body) because the crystallization of the porphyrin compound is promoted. In stead of the heating, other energy applying means such as light irradiation can be used. More specifically, a reverse Diels-Alder reaction (a retro Diels-Alder reaction) may be preferably used from the point that application process can be easily used.

A preferable method of producing the B layer when a bicyclo body is used as a precursor involves: dissolving the bicyclo body into an organic solvent; applying the solution to the substrate on which the A layer is formed; and heating the applied solution to obtain a crystallized film of the porphyrin compound.

The A layer and the B layer have only to be in intimate contact with each other at least at portions of the layers, and another device component such as a partial electrode may be interposed between the A layer and the B layer.

The surface of the A layer may be subjected to modification by means of a general approach as required prior to the application of the B layer.

The organic solvent to be used into which the bicyclo compound is dissolved is not particularly limited as long as the bicylo compound does not cause a reaction or precipitate. In addition, a mixture of two or more kinds of organic solvents may be used. A halogen solvent is preferably used in consideration of the smoothness of the applied film surface and the uniformity of the film thickness. Examples of the halogen solvent include chloroform, methylene chloride, dichloroethane, chlorobenzene, dichlorobenzene, trichlorobenzene, and 1,2-dichloroethylene. The concentration of the solution, which is arbitrarily adjusted in accordance with a desired thickness, is preferably in the range of 0.01 to 5 wt %.

A method of applying the B layer when a bicylo compound is used, along with that of applying the A layer, is not particularly limited, and the layer is applied by means of any one of the conventional coating methods such as the spin coating method, the cast method, the spray coating method, the doctor blade method, the die coating method, the dipping method, the printing method, the inkjet method, and the dropping method. Of those methods, the spin coating method, the dipping method, the spray coating method, and the inkjet method are preferable because an application amount can be controlled so that a film having a desired thickness is formed.

To prevent the intrusion of dirt or the like in a semiconductor layer as much as possible, it is desirable to filter the solution in advance by means of a membrane filter. This is because the intrusion of insoluble matter or dirt from the outside may obstruct uniform orientation, thereby causing an increase in OFF current and a reduction in ON/OFF ratio. In addition, preliminary drying at 130° C. or lower can be performed at the time of application of the bicyclo compound.

The applied and formed bicyclo skeleton is heated to cause a retro Diels-Alder reaction, with the result that the skeleton is transformed into an aromatic ring (benzo compound) in association with the elimination of an ethylene skeleton. Crystal growth due to stacking of porphyrin rings occurs simultaneously with the production of the aromatic ring, so a crystallized film of the porphyrin compound is obtained. In addition, an elimination reaction occurs at 140° C. or higher. A heating temperature for obtaining an increased field effect mobility is in the range of 150 to 280° C., preferably in the range of 170 to 230° C. A heating temperature of lower than 150° C. does not result in the formation of a sufficient crystallized film, while a heating temperature in excess of 280° C. results in the occurrence of cracks owing to abrupt film contraction.

The heating is performed on a hot plate, in an oven with internal air circulation, a vacuum oven, or the like, but a heating method is not limited. A method involving heating instantaneously on a hot plate is preferable for obtaining uniform orientation.

In addition, rubbing treatment in which the applied film before the heating is lightly rubbed with cloth or the like can be performed in order to obtain improved crystallinity. Examples of the cloth used for the rubbing treatment include, but not limited to, rayon, cotton, and silk.

Hereinafter, examples of a bicyclo body are shown. Unsubstituted and metal-free structures are mainly shown, but substituents, the position at which the bicyclo ring in the molecule is present, central metals, and central atomic groups are not limited. Of course, the compound of the present invention is not limited to those examples.

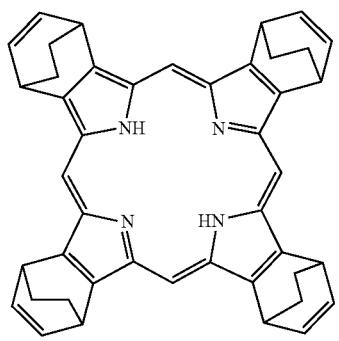

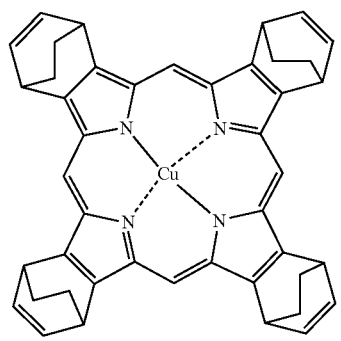

-continued

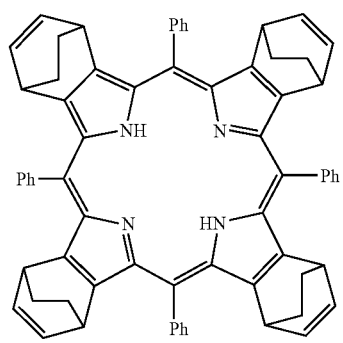

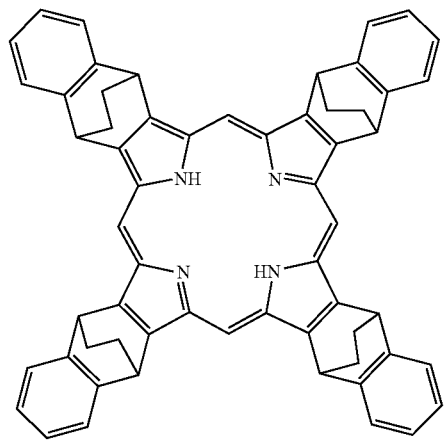

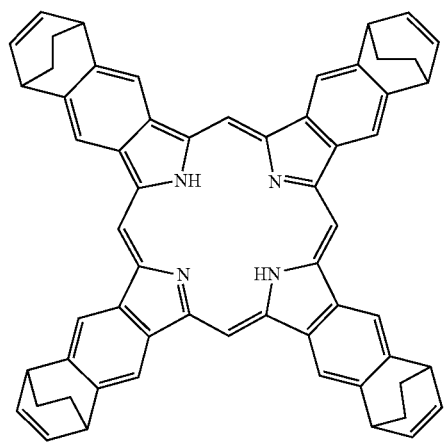

-continued
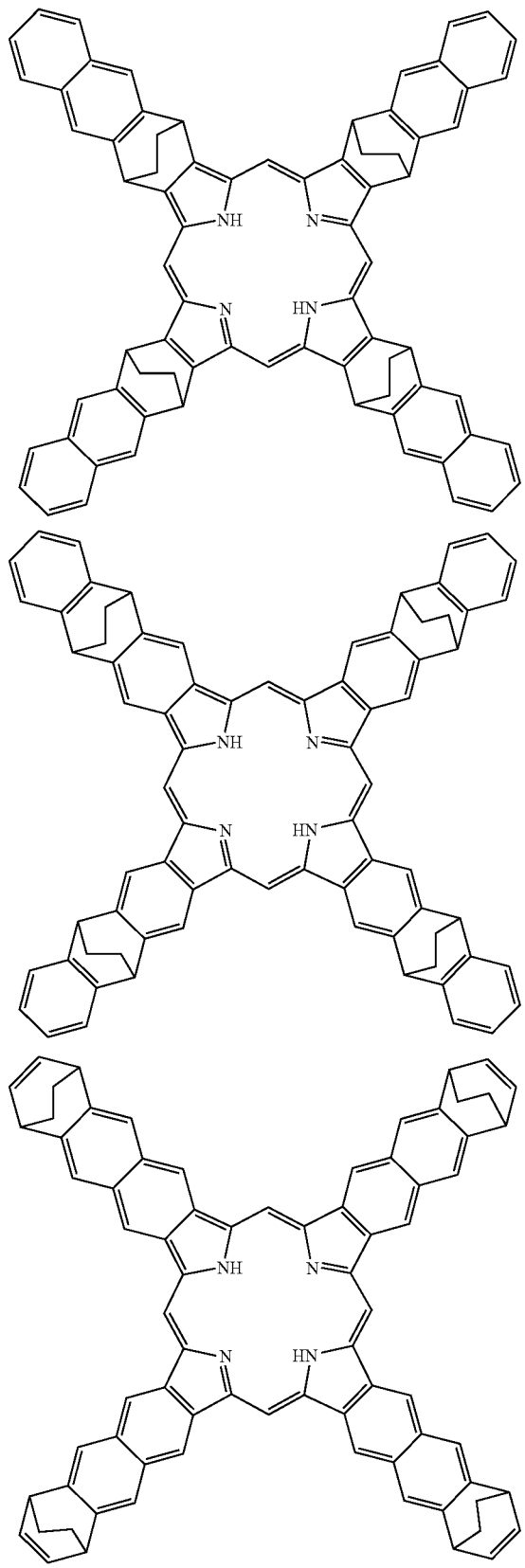
-continued
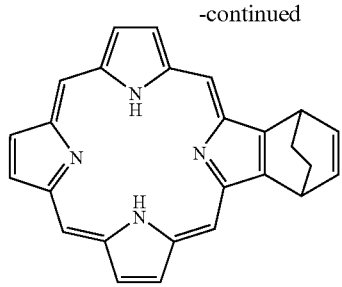
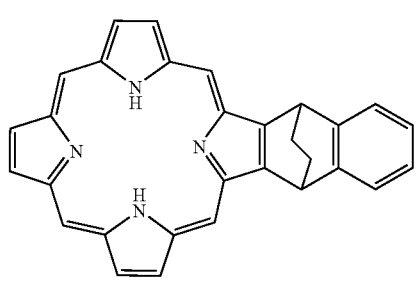
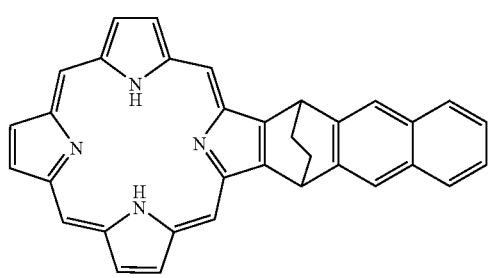
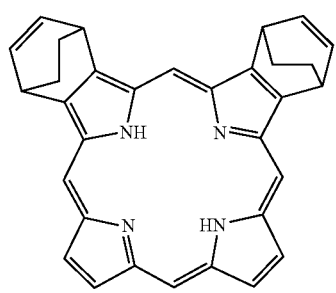
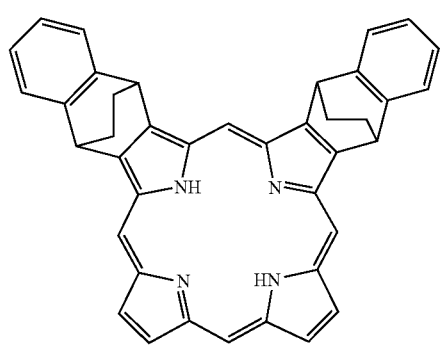

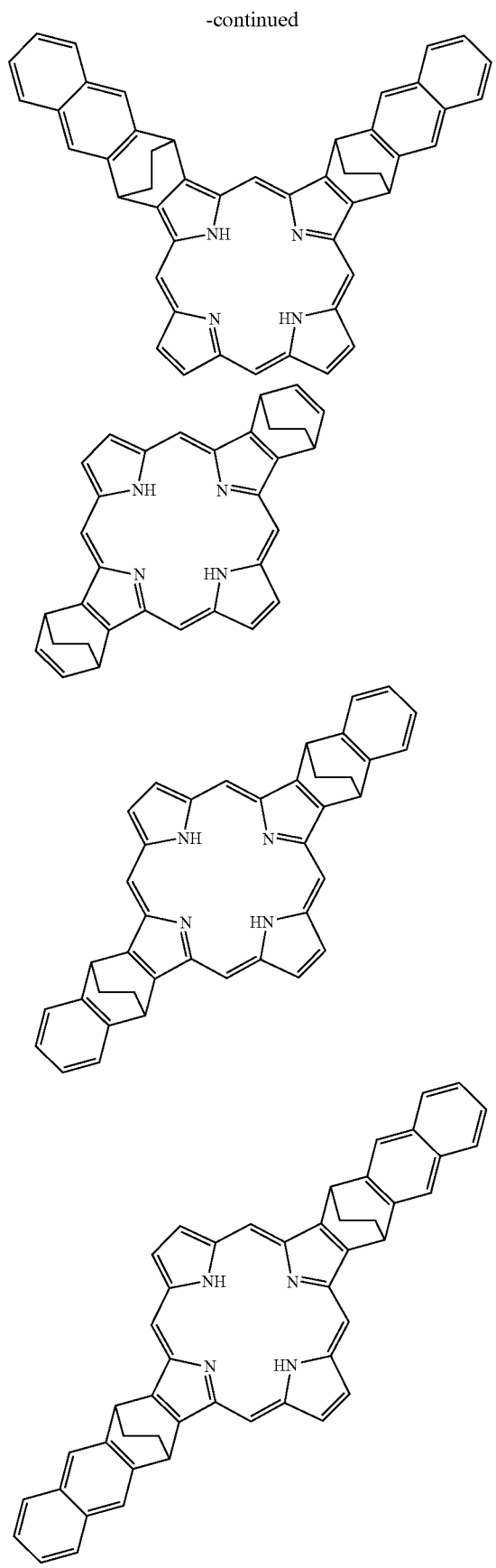

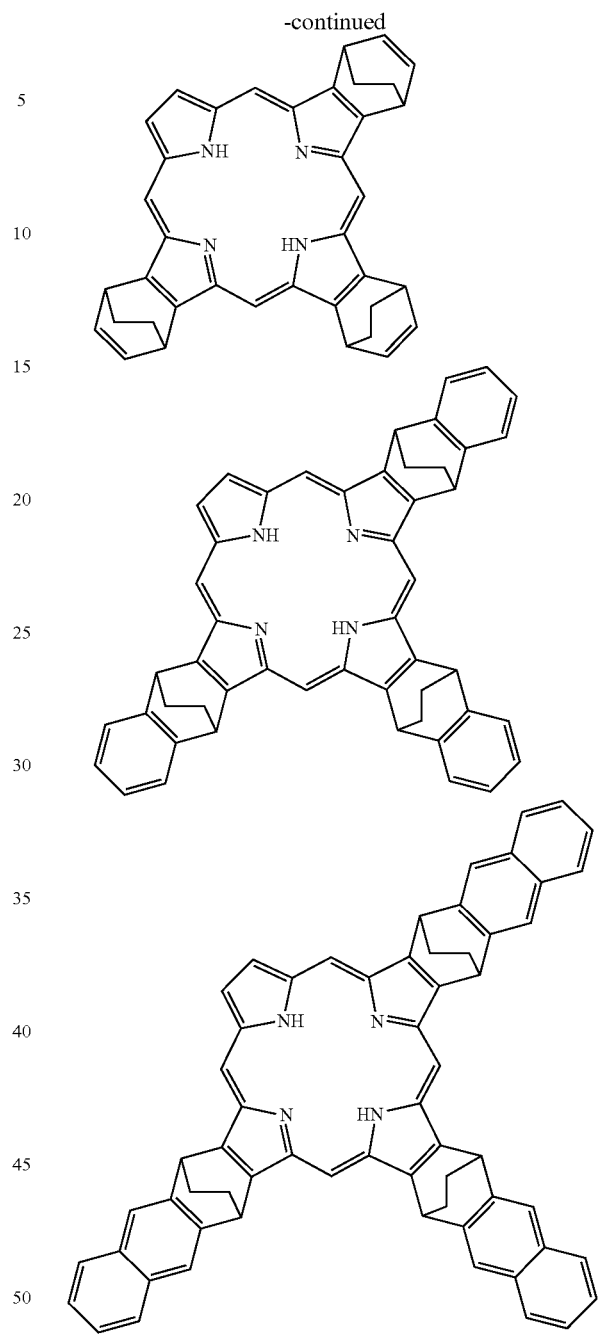

The thickness of the B layer obtained through those operations is in the range of 10 to 200 nm, preferably in the range of 20 to 150 nm. The thickness can be measured by means of a surface roughness measuring device, a level difference meter, or the like.

Furthermore, the B layer may be replaced with another general organic semiconductor compound such as phthalocyanine.

The organic film obtained in the present invention is most preferably used for a field effect transistor, but can be applied to other devices and the like.

Figure 1B:
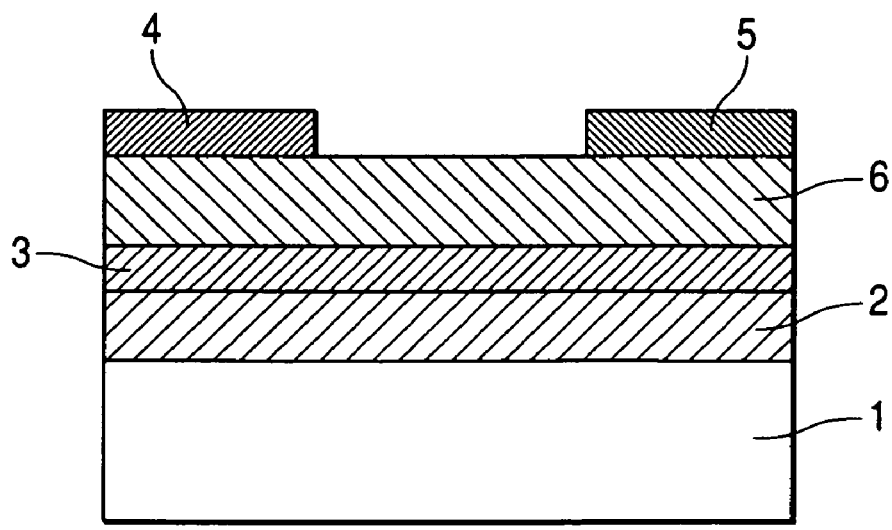

FIG. 1B is an enlarged schematic sectional drawing showing part of the field effect transistor of the present invention. The field effect transistor of the present invention is composed of the gate electrode 1, the insulating layer 2, the A layer 3 (polysiloxane compound layer), the source electrode 4, the drain electrode 5, and the B layer 6 (organic semiconductor layer). Although not shown in FIG. 1B, a substrate 8 is present on a side opposite to the insulating layer of the gate electrode 1.

The gate electrode, the source electrode, and the drain electrode are not particularly limited as long as they are made of conductive materials. Examples of the materials include: platinum, gold, silver, nickel, chromium, copper, iron, tin, antimonial lead, tantalum, indium, aluminum, zinc, magnesium, and alloys of those metals; conductive metal oxides such as an indium-tin oxide; and inorganic and organic semiconductors with increased conductivities through doping and the like such as a silicon single crystal, polysilicon, amorphous silicon, germanium, graphite, polyacetylene, polyparaphenylene, polythiophene, polypyrrol, polyaniline, polythienylenevinylene, and polyparaphenylenevinylene. Examples of a method of producing an electrode include a sputtering method, a vapor deposition method, a printing method from a solution or a paste, an inkjet method, and a dip method. In addition, an electrode material is preferably one out of the above materials that has small electrical resistance at a contact surface with the semiconductor layer.

The insulating layer may be any one as long as it allows the A layer to be uniformly applied, but is preferably one having a high dielectric constant and a low conductivity. Examples of an insulating material for such a layer include: inorganic oxides and nitrides such as silicon oxide, silicon nitride, aluminum oxide, titanium oxide, and tantalum oxide; polyacrylate; polymethacrylate; polyethylene terephthalate; polyimide; polyether; polyamide; polyamideimide; polybenzoxazole; polybenzothiazole; phenol resins; polyvinylphenol; and epoxy resins. Of the insulating materials, one having high surface smoothness is preferable. When the A layer itself is excellent in insulating properties, the A layer may be adjusted to a thickness that allows the insulating properties to be expressed to serve as a gate insulating layer. The configuration in this case is the same as that shown in FIG. 1A described above.

As described above, although not shown in FIG. 1B, the substrate 8 is present on the side opposite to the insulating layer of the gate electrode 1. FIG. 1B is the same as FIG. 1A in this respect.

Examples of the substrate 8 that can be suitably used in the present invention include those obtained by processing silicon, glass, metal, resin, and the like into plate, foil, film, and sheet shapes. In particular, a resin substrate is preferable from the viewpoints of flexibility and processability. Examples of a material to be used for the resin substrate include polyethylene terephthalate (PET), polyethylene naphthalate (PEN), polyimide (PI), polyetherimide (PEI), polyethersulfone (PES), polysulfone (PSF), polyphenylene sulfide (PPS), polyetheretherketone (PEEK), polyallylate (PAR), polyamideimide (PAI), a polycycloolefin resin, an acrylic resin, polystyrene, ABS, polyethylene, polypropylene, a polyamide resin, a polycarbonate resin, a polyphenylene ether resin, and a cellulosic resin. Organic-inorganic composite substrates and the like obtained by mixing inorganic oxide fine particles with or bonding inorganic materials to those resin materials may be used.

The field effect transistor structure in the present invention may be of any one of a top contact electrode type, a bottom contact electrode type, and a top gate electrode type. In addition, the structure is not limited to a horizontal type and may be of a vertical type.

According to a preferred embodiment of the present invention, there can be provided a field effect transistor which is excellent in crystallinity and orientation, and which exhibits a high field effect mobility.

In addition, according to a preferred embodiment of the present invention, there can be provided a method of producing a field effect transistor which enables the above field effect transistor to be easily obtained.

The field effect transistor of the present invention can be used for a plastic IC card, an information tag, a display, or the like because of its excellent crystallinity, excellent orientation, and high field effect mobility.

According to detailed studies conducted by the inventors of the present invention, the step of heating a bicyclo precursor on the A layer to obtain the B layer (that is, the step of forming the B layer by means of a retro Diels-Alder reaction) probably plays an important role in allowing the A layer to function as a crystallization promoting layer for the B layer.

In other words, when the bicyclo precursor is heated to cause an elimination reaction, a gap is observed to develop between crystal grains composed of the resultant compound. On the other hand, when such a reaction is allowed to occur on the A layer, the phenomenon in which a gap between crystal grains in the B layer is filled is observed.

This is probably because the A layer promotes stabilization of crystal grains (which may involve the movement and rotation of the crystal grains) or bonding between the crystal grains in the B layer.

The inventors of the present invention consider that an improvement in crystallinity of the B layer due to such an action of the A layer is the reason why the A layer functions as a crystallization promoting layer. The inventors consider that the occurrence of bonding between crystal grains is particularly preferable.

According to additional experimental studies conducted by the inventors of the present invention, energy equal to or greater than the energy necessary for transforming a precursor of the compound composing the B layer is applied to the precursor or the transformed compound, whereby such a crystallization reaction is promoted. Even after the completion of the transformation (elimination) from the precursor, the crystallization reaction is further promoted by continuously applying the energy such as heating.

That is, as described above, a layer having a function of promoting crystallization (a function of stabilizing crystal grains or a function of promoting bonding between the crystal grains) described above can be used as the crystallization promoting layer of the present invention instead of a layer composed of a specific polysiloxane compound such as one described above (A layer).

In addition, the organic semiconductor layer is not limited to a layer having a porphyrin compound (B layer), and has only to be a layer which is composed of a compound involving the transformation from a precursor and the crystallization of which is promoted by the crystallization promoting layer. A compound the molecular weight of which reduces owing to the transformation from a precursor is preferable as an organic semiconductor material in the organic semiconductor layer. More specifically, a layer containing pentacene obtained by eliminating a diazo group, a dicarbonyl group, and the like from a bicyclo body having these groups is also an organic semiconductor layer suitably used in the present invention.

It should be noted that an organic field effect transistor and a method of producing the same can be confirmed to be within the scope of the present invention as long as the following two points can be experimentally confirmed: one point is that at least one of the above-described movement, rotation, and bonding of crystal grains is promoted by the presence of a crystallization promoting layer in the step of forming an organic semiconductor layer and the other point is that a field effect mobility is increased by the presence of the crystallization promoting layer in the step.

Furthermore, in improving the performance of organic semiconductor layers, the concept of the present invention is useful not only in a method of producing a field effect transistor but also in methods of producing other organic devices, and, more widely, the whole methods of producing laminated bodies having organic semiconductor layers. All of those are included in the scope of the present invention.

Hereinafter, Synthesis Examples and Examples are shown. However, the present invention is not limited to these examples.

SYNTHESIS EXAMPLE 1

(Step 1-1)

A mixed solution of 3.16 g (39.5 mmol) of 1,3-cyclohexadiene, 10.5 g (34.1 mmol) of trans-1,2-bis(phenylsulfonyl)ethylene, and 200 ml of toluene was refluxed for 7 hours. After that, the solution was cooled and concentrated under reduced pressure to yield a reaction mixture. The reaction crude product was recrystallized (chloroform/hexane) to yield 5,6-bis(phenylsulfonyl)-bicyclo[2.2.2]octa-2-ene (13.8 g, 35.6 mmol, 90% yield).

(Step 1-2)

The reaction system of a mixed solution of 7.76 g (20 mmol) of the resultant 5,6-bis(phenylsulfonyl)-bicyclo[2.2.2]octa-2-ene and 50 ml of anhydrous tetrahydrofuran was replaced with nitrogen. Then, 2.425 ml (22 mmol) of ethyl isocyanoacetate were added to the solution, and the mixture was cooled to 0° C. Potassium t-butoxide (50 ml/1 M THF (tetrahydrofuran) solution) was dropped over 2 hours, and the whole was stirred at room temperature for 3 hours. After the completion of the reaction, dilute hydrochloric acid was added, and then the reaction mixture was washed with a saturated aqueous solution of sodium hydrogen carbonate, distilled water, and a saturated salt solution in this order, followed by drying with anhydrous sodium sulfate. The dried product was purified by means of silica gel column chromatography (chloroform) to yield ethyl-4,7-dihydro-4,7-ethano-2H-isoindole-1-carboxylate (3.5 g, 16 mmol, 80% yield).

(Step 1-3)

Under an argon atmosphere, a mixed solution of 0.42 g (1.92 mmol) of the resultant ethyl-4,7-dihydro-4,7-ethano-2H-isoindole-1-carboxylate and 50 ml of anhydrous THF was cooled to 0° C. Then, 0.228 g (6 mmol) of lithium aluminum hydride powder was added to the solution, and the whole was stirred for 2 hours. After that, THF was removed, the remainder was extracted with chloroform, and the extract was washed with a saturated aqueous solution of sodium hydrogen carbonate, distilled water, and a saturated salt solution in this order, followed by drying with anhydrous sodium sulfate. The reaction solution was filtered, replaced with argon, and shielded from light. Then, 10 mg of p-toluenesulfonic acid were added to the resultant, and the whole was stirred for 12 hours at room temperature. Furthermore, 0.11 g of p-chloranil was added to the mixture, and the whole was stirred for 12 hours at room temperature. Then, the mixture was washed with a saturated aqueous solution of sodium hydrogen carbonate, distilled water, and a saturated salt solution in this order, followed by drying with anhydrous sodium sulfate. After the concentration of the solution, alumina column chromatography (chloroform) and recrystallization (chloroform/methanol) were performed to yield a metal-free tetrabicyclo compound represented by the following formula (9) (0.060 g, 0.097 mmol, 20% yield).

Formula (9)

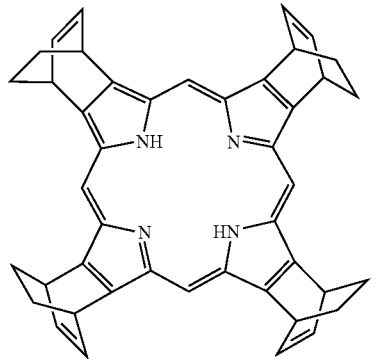

(Step 1-4)

A solution of 0.02 g (0.032 mmol) of the resultant metal-free tetrabicyclo compound and 0.019 g (0.1 mmol) of cupric acetate monohydrate in a mixture of 30 ml of chloroform and 3 ml of methanol was stirred at room temperature for 3 hours. The reaction solution was washed with distilled water and a saturated salt solution, and was dried with anhydrous sodium sulfate. After the concentration of the solution, the concentrated product was recrystallized with chloroform/methanol to yield a tetrabicyclo copper complex (0.022 g, 100% yield).

SYNTHESIS EXAMPLE 2

(Step 2-1)

2,4-pentanedione (205.4 ml, 2.0 mol), acetone (100 ml), n-butyl bromide (54 ml, 0.5 mol), and potassium carbonate (34.55 g, 0.25 mol) were fed into a reaction vessel, and the mixture was replaced with nitrogen, followed by reflux for 48 hours. The resultant solid was filtered out, and the solvent was distilled off by means of an evaporator. After that, unreacted 2,4-pentanedione was distilled off under reduced pressure by means of a diaphragm. Then, the remainder was distilled in a vacuum to yield 3-n-butyl 2,4-petanedione (43.25 g, 55% yield).

(Step 2-2)

Benzyl acetoacetate (97 ml, 560 mmol) and acetic acid (81 ml) were fed into a reaction vessel. Then, a solution of sodium nitrite (37.8 g) in water (115 ml) was dropped into the mixture at 10° C. or lower. After the dropping, the mixture was stirred for 3 hours at room temperature. A solution of 3-n-butyl 2,4-pentanedione (43.16 g, 280 mmol) obtained in Step 2-1 in acetic acid (45 ml), a mixture of zinc powder (36.6 g) and sodium acetate (25.9 g), and the above solution were fed into another vessel at 60° C. or lower, and the whole was stirred at 80° C. for 1 hour. After that, the reaction solution was poured into ice water (1.12 L), and the resultant precipitate was filtered and washed with water. The precipitate was dissolved into chloroform, and the whole was washed with water, a saturated aqueous solution of baking soda, and a saturated salt solution. The organic layer was dried with anhydrous sodium sulfate, concentrated, and distilled under reduced pressure by means of a diaphragm to remove an excess liquid. The remainder was purified by means of silica gel column chromatography (EtOAc/Hexane) 5 and recrystallized (MeOH) to yield 4-n-butyl-3,5-dimethylpyrrole benzylester (22.92 g, 24% yield).

(Step 2-3)

Acetic acid (200 ml) and acetic anhydride (3.09 ml) were fed into a reaction vessel. 4-n-butyl-3,5-dimethylpyrrole benzylester (8.56 g, 30 mmol) was dissolved into the mixture, and then lead tetraacetate (15.38 g, 31.5 mmol) was slowly added to the solution. After the mixture had been stirred for 2 hours, the completion of the reaction was confirmed by means of TLC, and ice water was poured into the reaction vessel. The produced precipitate was filtered, and the whole was washed with water thoroughly. The precipitate was dissolved into chloroform, and the whole was washed with water, a saturated aqueous solution of baking soda, and a saturated salt solution. The organic layer was dried with anhydrous sodium sulfate, concentrated under reduced pressure, and subjected to trituration with hexane to yield benzyl 5-acetoxymethyl-4-n-butyl-3-methylpyrrole-2-carboxylate (8.93 g, 87% yield).

(Step 2-4)

A reaction vessel was replaced with nitrogen, and 1-nitorpropane (8.93 ml, 100 mmol) and dry-THF (50 ml) were added. After DBU (1,8-diazabicyclo[5.4.0]-7-undecene) (1.5 ml, 10 mmol) had been added, propionaldehyde (4.68 ml, 100 mmol) was added while the vessel was cooled in an ice bath. After the mixture had been stirred at room temperature for 10 hours, ethyl acetate (100 ml) was added, and the whole was washed with dilute hydrochloric acid, water, and a saturated salt solution. The organic layer was dried with anhydrous sodium sulfate and concentrated under reduced pressure to yield 4-hydroxy-3-nitrohexane (12.33 g, 84% yield).

(Step 2-5)

4-hydroxy-3-nitrohexane (14.7 g, 100 mmol), acetic anhydride (14.8 ml, 157.3 mmol), chloroform (50 ml), and several drops of concentrated sulfuric acid were fed into a reaction vessel, and the mixture was stirred at room temperature for 10 hours. After the completion of the reaction, chloroform (50 ml) was added, and the whole was washed with water, a 5% aqueous solution of baking soda, and a saturated salt solution. The organic layer was dried with anhydrous sodium sulfate and concentrated under reduced pressure to yield 4-acetoxy-3-nitrohexane (16.3 g, 86% yield).

(Step 2-6)

After 4-acetoxy-3-nitrohexane (11.34 g, 60 mmol) had been added to a reaction vessel, the vessel was replaced with nitrogen, and dry-THF (150 ml) and ethyl isocyanoacetate (7.28 ml, 66 mmol) were added. Then, DBU (20.76 ml, 144 mmol) was slowly dropped while the vessel was cooled in an ice bath, and the whole was stirred at room temperature for 12 hours. After the completion of the reaction, 1 N hydrochloric acid was added, the whole was extracted with chloroform, and the extract was washed with water and a saturated salt solution. The organic layer was dried with anhydrous sodium sulfate and concentrated under reduced pressure. After that, the concentrated product was purified by means of silica gel column chromatography to yield ethyl 3,4-diethylpyrrole-2-carboxylate (10.97 g, 94% yield).

(Step 2-7)

Fed into a light-shielded reaction vessel equipped with a reflux condenser were 1.95 g (9.6 mmol) of ethyl-4,7-dihydro-4,7-ethano-2H-isoindole-1-carboxylate synthesized in Step 1-2, 100 ml of ethylene glycol, and 2.0 g of sodium hydroxide. Then, the vessel was replaced with nitrogen and the mixture was stirred at 175° C. for 2 hours. After that, the reaction solution cooled to room temperature was poured into ice water, the whole was extracted with chloroform, and the extract was washed with a saturated salt solution. The organic layer was dried with anhydrous sodium sulfate and concentrated under reduced pressure to yield 4,7-dihydro-4,7-ethano-2H-isoindole (0.98 g, 70.4% yield).

(Step 2-8)

Fed into a light-shielded reaction vessel equipped with a reflux condenser were ethyl 3,4-diethylpyrrole-2-carboxylate obtained in Step 2-6 (2.056 g, 10.53 mmol), ethylene glycol (100 ml), and potassium hydroxide (3.5 g). Then, the vessel was replaced with nitrogen and the mixture was stirred at 160° C. for 2.5 hours. After that, the reaction solution cooled to room temperature was poured into ice water, the whole was extracted with ethyl acetate, and the extract was washed with an aqueous solution of baking soda, water, and a saturated salt solution. The organic layer was dried with anhydrous sodium sulfate and concentrated under reduced pressure. Again, 3,4-diethylpyrrole obtained by this reaction, benzyl-5-acetoxymethyl-4-n-butyl-3-methylpyrrole-2-carboxylate obtained in Step 2-3 (7.21 g, 21 mmol), acetic acid (10 ml), and ethanol (150 ml) were fed into a light-shielded reaction vessel equipped with a reflux condenser, and the mixture was refluxed for 18 hours. After the reflux, the resultant was cooled to room temperature, ethanol (50 ml) was added, and the whole was left standing at 0° C. for 5 hours. The precipitated crystal was filtered and washed with ethanol thoroughly to yield 2,5-bis(5-benzylcarbonyl-3-n-butyl-4-methyl-2-pyrroylmethyl)-3,4-dimethyl-1H-pyrrole (5.25 g, 72% yield).

(Step 2-9)

Pd/C (0.5 g) and dry-THF (20 ml) were fed into a three-necked flask, and the mixture was replaced with hydrogen and stirred for 30 minutes. A solution prepared by dissolving 2,5-bis(5-benzylcarbonyl-3-n-butyl-4-methyl-2-pyrroylmethyl)-3,4-dimethyl-1H-pyrrole (2.09 g, 3.03 mmol) into dry-THF (30 ml) was slowly dropped into the mixture, and the whole was stirred as it was at room temperature overnight. After the stirring, the solution was subjected to Celite filtration. The filtrate was concentrated under reduced pressure, shielded from light, replaced with nitrogen, and cooled in an ice bath. TFA (5 ml) was dropped as it was, and the mixture was stirred for 10 minutes. After that, $CH(OMe)_3$ (10 ml) was slowly dropped, and the mixture was stirred at 0° C. for 1 hour. After the solution had been neutralized with 1 M NaOH (solution of $MeOH/H_2O=1/1$), the resultant was poured into ice water. As a result, a brown solid precipitated. The solid was filtered, washed with water, and rinsed with hexane to yield 2,5-bis(5-formyl-3-n-butyl-4-methyl-2-pyrroylmethyl)-3,4-diethyl-1H-pyrrole (1.94 g, 60% yield).

(Step 2-10)

4,7-dihydro-4,7-ethano-2H-isoindole (0.12 g, 0.84 mmol) obtained in Step 2-7, 2,5-bis(5-formyl-3-n-butyl-4-methyl-2-pyrroylmethyl)-3,4-diethyl-1H-pyrrole (0.40 g, 0.84 mmol) obtained in Step 2-9, and chloroform (200 ml) were fed into a light-shielded reaction vessel, and the mixture was replaced with nitrogen. TFA (10.0 ml) was added to the solution, and the mixture was stirred at 50° C. for 18 hours. After the stirring, triethylamine (18.0 ml) was slowly dropped to neutralize the solution. After that, chloranil (0.21 g, 0.84 mmol) was added, and the mixture was stirred overnight. The resultant was quenched with an aqueous solution of sodium thiosulfate, and the organic layer was washed with water and a saturated salt solution and dried with anhydrous sodium sulfate. Zinc acetate was added to the dried product, and the whole was stirred at room temperature for 2 days. Then, the resultant was washed with water and a saturated salt solution, dried with anhydrous sodium sulfate, concentrated under reduced pressure, and purified by means of silica gel column chromatography to yield a monobicyclo zinc complex (0.17 g, 32% yield)

(Step 2-11)

The resultant monobicyclo zinc complex (0.052 g, 0.08 mmol) was fed into a reaction vessel, replaced with nitrogen, and dissolved into chloroform (10 ml). Trifluoroacetic acid (4.5 ml) was slowly added to the solution, and the whole was stirred for 1 hour. The reaction solution was poured into water, the whole was extracted with chloroform, and the extract was washed with a saturated salt solution. The organic layer was dried with anhydrous sodium sulfate and concentrated under reduced pressure to yield a metal-free monobicyclo compound represented by the following formula (10) (0.038 g, 81% yield).

Formula (10)

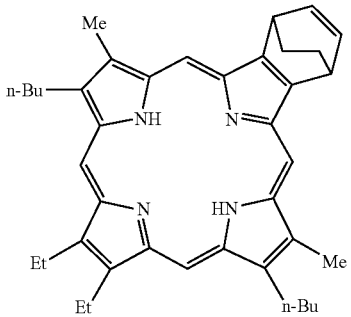

(Step 2-12)

The resultant metal-free monobicyclo compound (0.041 g, 0.07 mmol) was fed into a reaction vessel, replaced with nitrogen, and dissolved into chloroform (25 ml). Cupric acetate monohydrate (0.028 g, 0.14 mmol) was added to the solution, and the whole was stirred overnight. The reaction solution was poured into water, the whole was extracted with chloroform, and the extract was washed with a saturated salt solution. The organic layer was dried with anhydrous sodium sulfate and concentrated under reduced pressure to yield a monobicyclo copper complex (0.038 g, 87% yield).

(Preparation of a Resin Solution a)

1.0 g of commercially available flaky methylsilsesquioxane (MSQ) (manufactured by Showa Denko K. K., trade name GR650) was dissolved into a mixed solvent composed of 49.5 g of ethanol and 49.5 g of 1-butanol to prepare a resin solution a.

(Preparation of a Resin Solution b)

0.975 g of commercially available-flaky methylsilsesquioxane (MSQ) (manufactured by Showa Denko K. K., trade name GR650) and 0.025 g of tetraethoxysilane were completely dissolved into a mixed solvent composed of 49.4 g of ethanol and 49.5 g of 1-butanol. 0.02 g of distilled water and 0.05 g of formic acid were added to the solution, and the whole was stirred at room temperature for 48 hours to prepare a resin solution b.

(Preparation of a Resin Solution c)

0.8 g of commercially available flaky phenylsilsesquioxane (PSQ) (manufactured by Showa Denko K. K., trade name GR950) and 0.2 g of tetraethoxysilane were completely dissolved into a mixed solvent composed of 49.3 g of ethanol and 49.5 g of 1-butanol. 0.14 g of distilled water and 0.05 g of formic acid were added to the solution, and the whole was stirred at room temperature for 48 hours to prepare a resin solution c.

(Preparation of a Silica Sol d)

1.0 g of methyltrimethoxysilane was completely dissolved into a mixed solvent composed of 49.5 g of ethanol and 49.5 g of 1-butanol. 0.83 g of distilled water and 0.05 g of formic acid were added to the solution, and the whole was stirred at room temperature for 48 hours to prepare a silica sol c.

(Preparation of a Silica Sol e)

0.8 g of dimethyldimethoxysilane and 0.2 g of tetramethoxysilane were completely dissolved into a mixed solvent composed of 48.8 g of ethanol and 49.5 g of 1-butanol. 0.67 g of distilled water and 0.05 g of formic acid were added to the solution, and the whole was stirred at room temperature for 48 hours to prepare a silica sol e.

EXAMPLE 1

FIG. 1B shows the structure of a field effect transistor in this example.

First, a highly doped N type silicon substrate was provided as the gate electrode 1. A silicon oxide film having a thickness of 5,000 Å obtained by thermal oxidation of the surface layer of the silicon substrate was provided as the insulating layer 2. Next, the resin solution a was applied to the surface of the insulating layer by means of a spin coating method (at a number of revolutions of 5,000 rpm). Next, the applied film was moved onto a hot plate and heated at 100° C. for 5 minutes and 200° C. for 20 minutes. Measurement with stylus-type step difference measuring device showed that the film had a thickness of 50 nm. The film was provided as the A layer 3 (polysiloxane layer).

Next, the metal-free tetrabicyclo compound synthesized in Synthesis Example (1) in powder form was heated in a vacuum at 200° C. to be transformed into a benzo compound, and was then formed into a film on the substrate by using a vacuum vapor deposition apparatus capable for which vacuum evacuation was performed by means of a diffusion pump. The film was provided as the B layer 6 (organic semiconductor layer). Conditions for producing a deposited film are as follows. The degree of vacuum in the chamber of the evaporator was $1 \times 10^{-6}$ torr, the temperature of the substrate was 220° C., the deposition temperature was calculated from a quartz crystal micro-balance, and the thickness and the deposition rate were 100 nm and 0.5 to 1.5 Å/s, respectively. After that, the gold source electrode 4 and the drain electrode 5 were produced by using a mask. Conditions for producing each of the electrodes are as follows. The degree of vacuum in the chamber of the vapor deposition apparatus was $1 \times 10^{-6}$ torr, the temperature of the substrate was room temperature, and the thickness was 100 nm.

A field effect transistor having a channel length L of 50 μm and a channel width W of 3 mm was produced according to the above procedure. The $V_d$-$I_d$ and $V_g$-$I_d$ curves of the produced transistor were measured by using a Parameter Analyzer 4156C (trade name) manufactured by Agilent.

The mobility μ ($cm^2/Vs$) was calculated in accordance with the following equation (1).

$$I_d = \mu(C_i W/2L) \times (V_g - V_{th})^2 \quad \text{(Eq. 1)}$$

In the equation, reference symbol $C_i$ denotes the capacitance per unit area of the gate insulating film ($F/cm^2$), reference symbols W and L denote a channel width (mm) and a channel length (μm) shown in the example, respectively, and reference symbols $I_d$, $V_g$, and $V_{th}$ denote a drain current (A), a gate voltage (V), and a threshold voltage (V), respectively.

In addition, a ratio between $I_d$'s at $V_g$=−80 V and 0 V at $V_d$=−80 V was provided as an ON/OFF ratio. Table 1 shows the results.

EXAMPLE 2

A device was produced by the same operations as those of Example 1 except that the metal-free tetrabicyclo body used in Example 1 was changed to the tetrabicyclo copper complex synthesized in Synthesis Example 1, and the device was evaluated for electrical characteristics. Table 1 shows the results.

EXAMPLE 3

The same operations as those of Example 1 up to the production of the A layer were performed. A 1-wt % solution of the metal-free tetrabicyclo body synthesized in Synthesis Example 1 in chloroform was applied onto the substrate by means of a spin coating method (at a number of revolutions of 1,000 rpm) to form an applied film. Furthermore, the substrate was heated at 220° C. to form the B layer 6 composed of a benzo body. The organic semiconductor layer had a thickness of 100 nm. Gold was deposited onto the layer to form the source electrode 4 and the drain electrode 5.

A field effect transistor having a channel length L of 50 μm and a channel width W of 3 mm was produced according to the above procedure, and was similarly evaluated for electrical characteristics. Table 1 shows the results.

Figure 4:
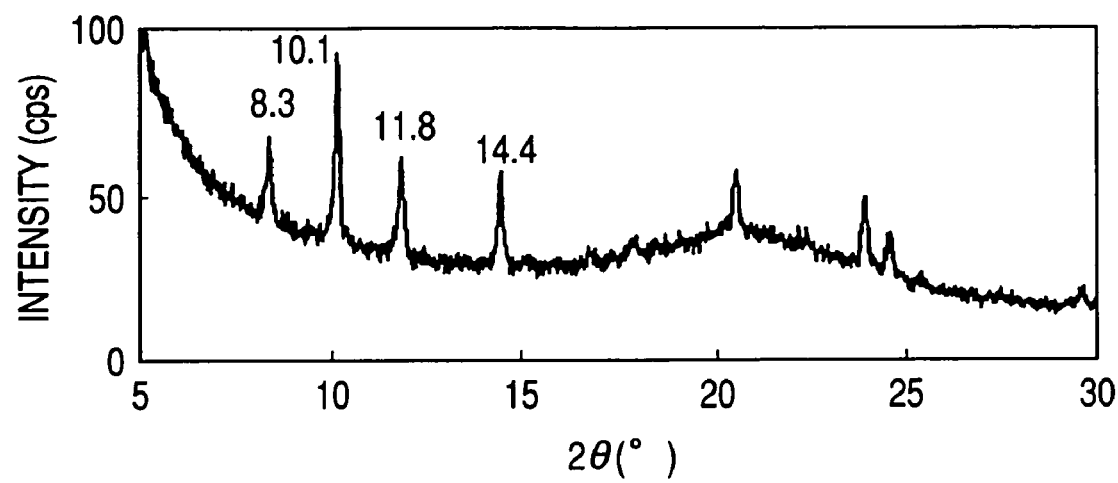
FIG. 4 is an X-ray diffraction pattern on a transistor substrate obtained in Example 3 of the present invention.

In addition, CuKα X-ray diffraction measurement was performed for the produced transistor substrate under the following conditions. FIG. 4 shows the results.

Instrument used: RAD-RX wide-angle X-ray diffraction apparataus manufactured by Rigaku Denki
  X-ray bulb: Cu
  Tube voltage: 50 kV
  Tube current: 150 mA
  Scanning method: 2θ/θ scan
  Scanning rate: 2 deg./min.
  Sampling interval: 0.02 deg.
  Integration time: 1 s
  Number of integrations: 14 times
  Measurement temperature: room temperature (20° C.)
  It should be noted that θ=0° was set at a substrate plane.

In addition, in the present invention, the shape and position of a peak of X-ray diffraction may slightly vary depending on conditions at the time of production. In addition, the tip of a peak may split.

EXAMPLE 4

Figure 2:
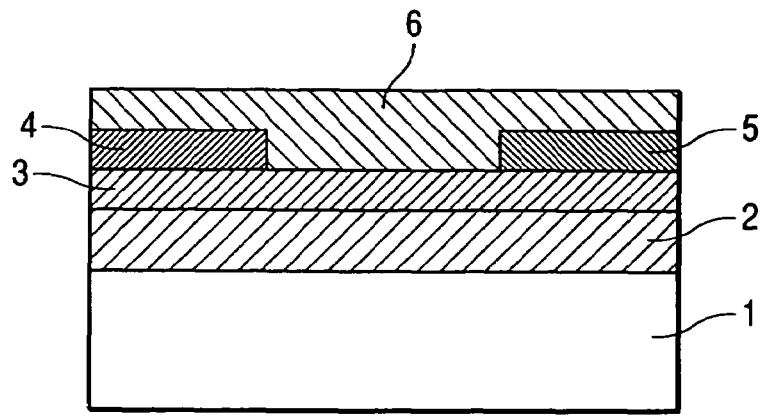
FIG. 2 is a schematic sectional drawing showing part of a field effect transistor according to Example 4 of the present invention.

FIG. 2 shows the structure of a field effect transistor in this example.

First, a highly doped N type silicon substrate was provided as the gate electrode 1. A silicon oxide film having a thickness of 5,000 Å obtained by thermal oxidation of the surface layer of the silicon substrate was provided as the insulating layer 2. Next, the resin solution a was applied to the layer by the same operation as that of Example 1. The film had a thickness of 50 nm. The film was provided as the A layer 3. Gold was deposited onto the layer by the same operation as that of Example 1 to form the source electrode 4 and the drain electrode 5. A 1-wt % solution of the metal-free tetrabicyclo compound synthesized in Synthesis Example 1 in chloroform was applied onto the substrate by means of a spin coating method (at a number of revolutions of 1,000 rpm) to form an applied film. Furthermore, the substrate was heated at 220° C. to form the B layer 6 composed of a benzo compound. The B layer had a thickness of 100 nm.

A field effect transistor having a channel length L of 50 μm and a channel width W of 3 mm was produced according to the above procedure.

The transistor was evaluated for electrical characteristics in the same manner as in Example 1. Table 1 shows the results.

EXAMPLE 5

Figure 3:
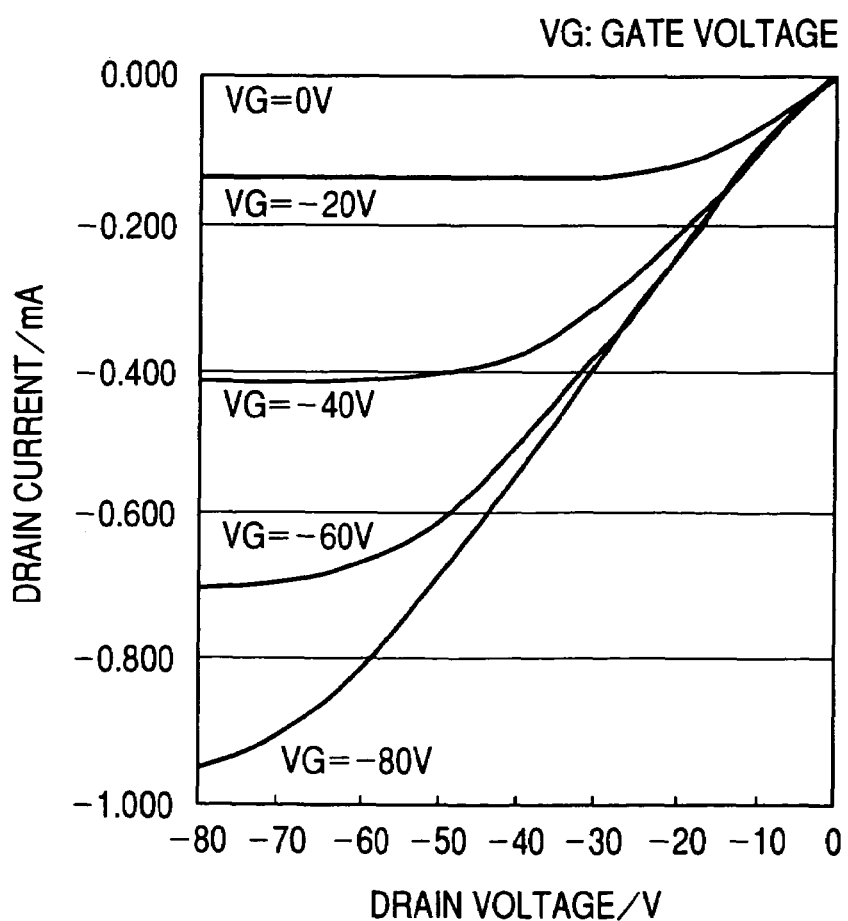
FIG. 3 is a drawing showing electrical characteristics of a field effect transistor obtained in Example 5 of the present invention.
Figure 5:
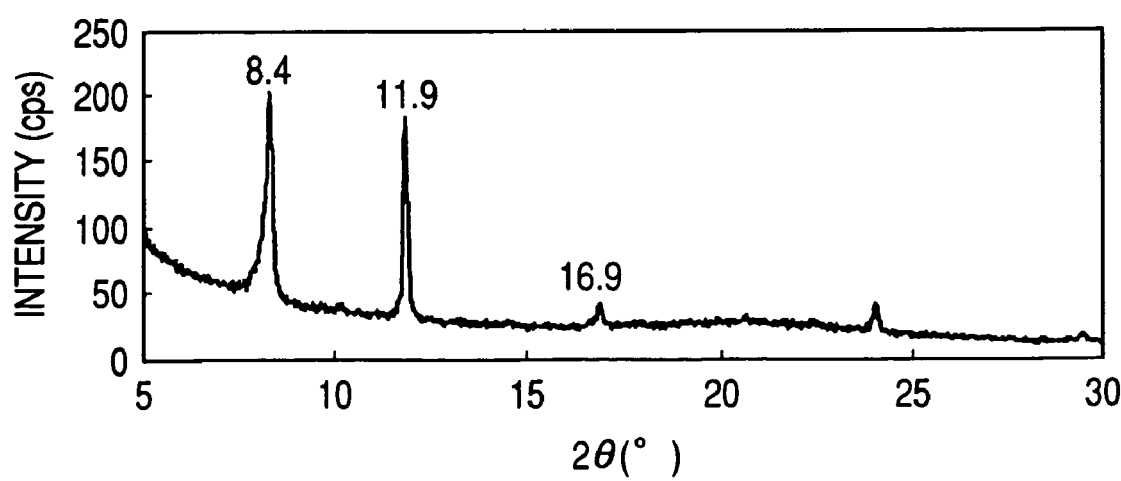
FIG. 5 is an X-ray diffraction pattern on a transistor substrate obtained in Example 5 of the present invention.

A device was produced by the same operations as those of Example 3 except that the metal-free tetrabicyclo compound used in Example 3 was changed to the tetrabicyclo copper complex, and the device was evaluated for electrical characteristics. Table 1 and FIG. 3 show the results. In addition, CuKα X-ray diffraction measurement was performed for the produced transistor substrate under the same conditions as those of Example 3. FIG. 5 shows the results.

COMPARATIVE EXAMPLE 1

The same operations as those of Example 4 were performed except that: the step of producing the A layer was omitted; the thickness of the silicon oxide film was changed to 3,000 Å; the concentration of the solution of the metal-free tetrabicyclo compound was changed to 2 wt %; the substrate was sintered at 210° C. for 10 minutes; and the channel length L and the channel width W were changed to 25 μm and 0.25 mm, respectively. Table 1 shows the results.

EXAMPLE 6

Figure 6:
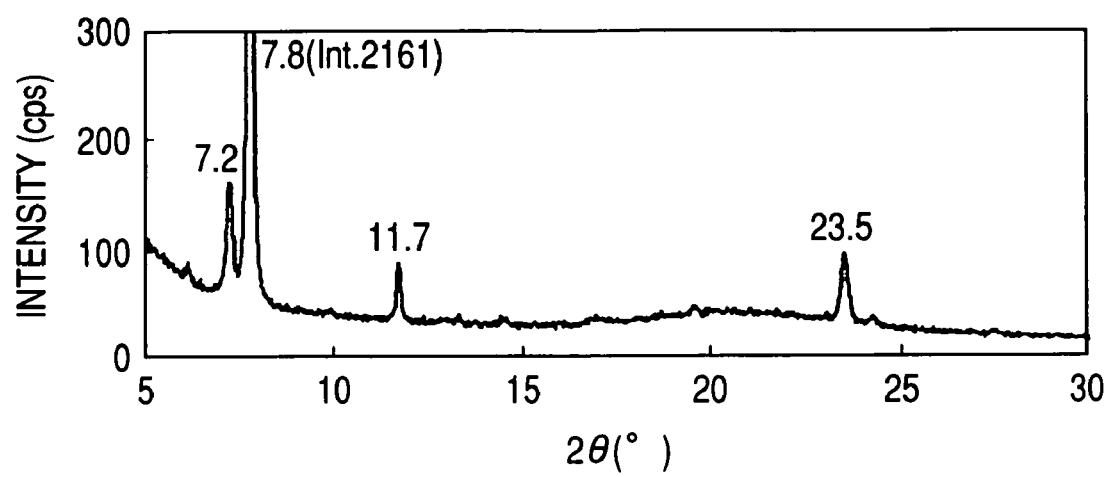
FIG. 6 is an X-ray diffraction pattern on a transistor substrate obtained in Example 6 of the present invention.

A device was produced by the same operations as those of Example 3 except that the metal-free tetrabicyclo compound used in Example 3 was changed to the metal-free monobicyclo compound synthesized in Synthesis Example 2, and the device was evaluated for electrical characteristics. Table 1 shows the results. In addition, CuKα X-ray diffraction measurement was performed for the produced transistor substrate under the same conditions as those of Example 3. FIG. 6 shows the results.

EXAMPLE 7

Figure 7:
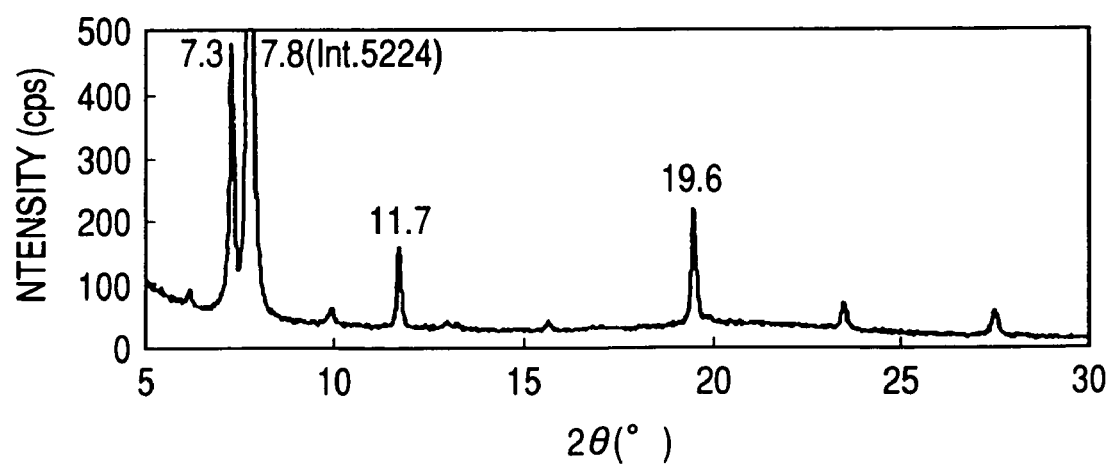
FIG. 7 is an X-ray diffraction pattern on a transistor substrate obtained in Example 7 of the present invention.

A device was produced by the same operations as those of Example 3 except that the metal-free tetrabicyclo compound used in Example 3 was changed to the monobicyclo copper complex synthesized in Synthesis Example 2, and the device was evaluated for electrical characteristics. Table 1 shows the results. In addition, CuKα X-ray diffraction measurement was performed for the produced transistor substrate under the same conditions as those of Example 3. FIG. 7 shows the results.

EXAMPLE 8

The resin solution b was applied by the same operation as that of Example 1 to a highly doped N type silicon substrate having a silicon oxide film similar to that of Example 4. The film had a thickness of 50 nm. The film was provided as the A layer 3. A 1-wt % solution of the tetrabicyclo copper complex in chloroform was applied onto the substrate by means of a spin coating method (at a number of revolutions of 1,000 rpm) to form an applied film. Furthermore, the substrate was heated at 220° C. to form the B layer 6 composed of a benzo compound. The organic semiconductor layer had a thickness of 100 nm. Gold was deposited onto the layer by the same operation as that of Example 1 to form the source electrode 4 and the drain electrode 5. Table 1 shows the results.

EXAMPLE 9

A device was produced by the same operations as those of Example 8 except that an applied film having a thickness of 50 nm was formed by using the resin solution c and was provided as the A layer 3, and the device was evaluated for electrical characteristics. Table 1 shows the results.

EXAMPLE 10

A device was produced by the same operations as those of Example 8 except that an applied film having a thickness of 50 nm was formed by using the silica. sol d and was provided as the A layer 3, and the device was evaluated for electrical characteristics. Table 1 shows the results.

EXAMPLE 11

A device was produced by the same operations as those of Example. 8 except that an applied film having a thickness of 50 nm was formed by using the silica sol e and was provided as the A layer 3, and the device was evaluated for electrical characteristics. Table 1 shows the results.

EXAMPLE 12

Figure 8:
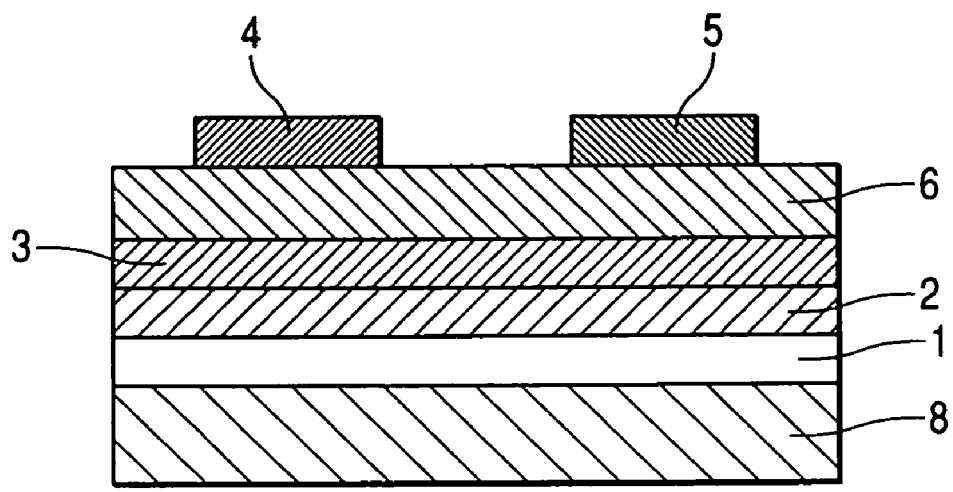
FIG. 8 is a schematic sectional drawing showing a field effect transistor of Example 12 of the present invention.

FIG. 8 shows the structure of a field effect transistor in this example.

First, a silver nanoparticle paste (manufactured by Nippon Paint Co., Ltd., Fine Sphere SVE102) was applied onto a PET substrate 8 provided with a planarizing layer having a thickness of 3 μm on the substrate surface, and the paste heated in an oven with internal air circulation at 180° C. for 30 minutes to form the gate electrode 1 having a thickness of 130 nm. A thermosetting resin composition of phenol novolac resin/hexamethoxymethylmelamine/p-toluenesulfonic acid/1-butanol/ethanol=10.5/4.5/0.075/59.5/25.5 (weight ratio) was applied onto the electrode, and the composition was heated in an oven with internal air circulation at 180° C. for 60 minutes to form the insulating layer 2 having a thickness of 600 nm. Next, the resin solution b was applied to the surface of the insulating layer by means of a spin coating method (at a number of revolutions of 3,000 rpm). Next, the applied film was heated in an oven with internal air circulation at 180° C. for 20 minutes. The film had a thickness of 60 nm. The film was provided as the A layer 3. A 1-wt % solution of the metal-free tetrabicyclo compound synthesized in Synthesis Example 1 in chloroform was applied onto the substrate by means of a spin coating method (at a number of revolutions of 1,000 rpm) to form an applied film. Furthermore, the substrate was heated at 220° C. to form the B layer 6 composed of a benzo body. The organic semiconductor layer had a thickness of 100 nm. Gold was deposited onto the layer by the same operation as that of Example 1 to form the source electrode 4 and the drain electrode 5. Table 1 shows the results.

EXAMPLE 13

Figure 9:
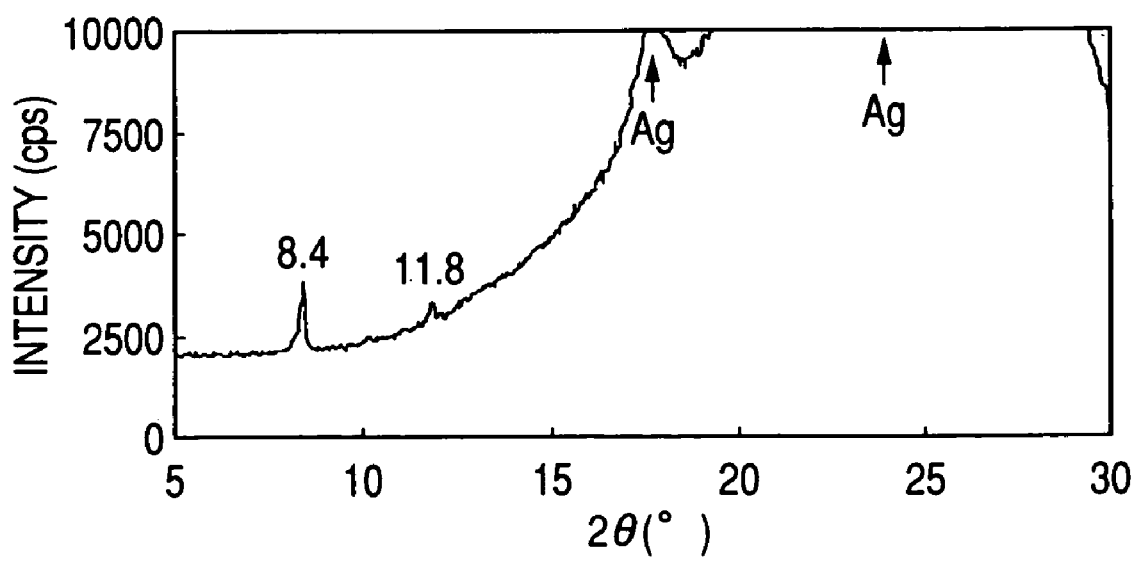
FIG. 9 is an X-ray diffraction pattern of a transistor substrate obtained in Example 13 of the present invention.

A device was produced by the same operations as those of Example 11 except that the metal-free tetrabicyclo compound used in Example 12 was changed to the tetrabicyclo copper complex, and the device was evaluated for electrical characteristics. Table 1 shows the results. In addition, CuKα X-ray diffraction measurement was performed for the produced transistor substrate under the same conditions as those of Example 3. FIG. 9 shows the results.

EXAMPLE 14

A device was produced by the same operations as those of Example 13 except that heating time to form the B layer 6 from tetrabicyclo copper complex was changed to 1, 5 and 10 minutes, and the device was evaluated for electrical characteristics. FIG. 10 shows the results.

EXAMPLE 15

A device was produced by the same operations as those of Example 5 except that heating to form the B layer 6 from tetrabicyclo copper complex was conducted in an oven with internal air circulation at 180° C. and heating time was changed to 30, 60 and 90 minutes, and the device was evaluated for electrical characteristics. FIG. 11 shows the results.

COMPARATIVE EXAMPLE 2 those of Example 14 except that the step of producing the A layer 3, and the device was evaluated for electrical characteristics. FIG. 10 shows the results.

COMPARATIVE EXAMPLE 3

A device was produced by the same operations as those of Example 15 except that the step of producing the A layer 3, and the device was evaluated for electrical characteristics. FIG. 10 shows the results.

TABLE 1

|  | Mobility (cm$^2$/Vs) | ON/OFF ratio |
|---|---|---|
| Example 1 | $1.1 \times 10^{-1}$ | $2.1 \times 10^5$ |
| Example 2 | $5.1 \times 10^{-1}$ | $1.1 \times 10^5$ |
| Example 3 | $5.2 \times 10^{-1}$ | $2.4 \times 10^5$ |
| Example 4 | $1.3 \times 10^{-1}$ | $1.2 \times 10^5$ |
| Example 5 | $1.8 \times 10^{0}$ | $1.4 \times 10^5$ |
| Example 6 | $5.4 \times 10^{-3}$ | $3.2 \times 10^5$ |
| Example 7 | $1.2 \times 10^{-2}$ | $1.9 \times 10^5$ |
| Example 8 | $1.2 \times 10^{0}$ | $1.1 \times 10^5$ |
| Example 9 | $7.2 \times 10^{-1}$ | $8.2 \times 10^4$ |
| Example 10 | $1.0 \times 10^{0}$ | $1.0 \times 10^5$ |
| Example 11 | $6.2 \times 10^{-1}$ | $7.5 \times 10^4$ |
| Example 12 | $2.8 \times 10^{-1}$ | $6.0 \times 10^4$ |
| Example 13 | $2.6 \times 10^{0}$ | $4.4 \times 10^4$ |
| Comparative Example 1 | $1.2 \times 10^{-3}$ | $1.1 \times 10^4$ |

This application claims priority from Japanese Patent Application No. 2004-067671 filed on Mar. 10, 2004, which is hereby incorporated by reference herein.

The invention claimed is:

1. A field effect transistor having an organic semiconductor layer, comprising:
   an organic semiconductor layer containing at least porphyrin; and
   a layer composed of at least a polysiloxane compound, the layer being laminated on the organic semiconductor layer so as to be in intimate contact with the organic semiconductor layer,
   wherein Bragg angles (2θ) of CuKα X-ray diffraction in the organic semiconductor layer have peaks at 8.3°±0.2°, 10.1°±0.2°, 11.8°±0.2°, and 14.4°±0.2°.

2. A field effect transistor having an organic semiconductor layer, comprising:

an organic semiconductor layer containing at least porphyrin; and a layer composed of at least a polysiloxane compound, the layer being laminated on the organic semiconductor layer so as to be in intimate contact with the organic semiconductor layer, wherein Bragg angles (2θ) of CuKα X-ray diffraction in the organic semiconductor layer have peaks at 8.4°±0.2°, 11.9°±0.2°, and 16.9°±0.2°.

3. A field effect transistor having an organic semiconductor layer, comprising:

an organic semiconductor layer containing at least porphyrin; and a layer composed of at least a polysiloxane compound, the layer being laminated on the organic semiconductor layer so as to be in intimate contact with the organic semiconductor layer, wherein Bragg angles (2θ) of CuKα X-ray diffraction in the organic semiconductor layer have peaks at 7.2°±0.2°, 7.8°±0.2°, 11.7°±0.2°, and 23.5°±0.2°.

4. A field effect transistor having an organic semiconductor layer, comprising:

an organic semiconductor layer containing at least porphyrin; and a layer composed of at least a polysiloxane compound, the layer being laminated on the organic semiconductor layer so as to be in intimate contact with the organic semiconductor layer, wherein Bragg angles (2θ) of CuKα X-ray diffraction in the organic semiconductor layer have peaks at 7.3°±0.2°, 7.8°±0.2°, 11.7°±0.2°, and 19.6°±0.2°.

* * * * *